(12) United States Patent
Spory

(10) Patent No.: US 10,109,606 B2
(45) Date of Patent: *Oct. 23, 2018

(54) REMAPPED PACKAGED EXTRACTED DIE

(71) Applicant: Erick Merle Spory, Colorado Springs, CO (US)

(72) Inventor: Erick Merle Spory, Colorado Springs, CO (US)

(73) Assignee: Global Circuit Innovations, Inc., Colorado Springs, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/792,312

(22) Filed: Oct. 24, 2017

(65) Prior Publication Data

US 2018/0047685 A1 Feb. 15, 2018

Related U.S. Application Data

(63) Continuation-in-part of application No. 13/623,603, filed on Sep. 20, 2012, which is a continuation of
(Continued)

(51) Int. Cl.
*H01L 23/00* (2006.01)
*H01L 23/26* (2006.01)
(Continued)

(52) U.S. Cl.
CPC ............ *H01L 24/05* (2013.01); *H01L 23/057* (2013.01); *H01L 23/10* (2013.01); *H01L 23/26* (2013.01);
(Continued)

(58) Field of Classification Search
CPC .................... H01L 23/49541; H01L 23/49513
See application file for complete search history.

(56) References Cited

U.S. PATENT DOCUMENTS 4,012,832 A * 3/1977 Crane .................... H01L 24/32
252/514
4,426,769 A 1/1984 Grabbe
(Continued)

FOREIGN PATENT DOCUMENTS

WO WO2011-101272 A1 8/2011

OTHER PUBLICATIONS

Official Action for U.S. Appl. No. 14/565,626, dated Aug. 28, 2015.
(Continued)

*Primary Examiner* — Joseph C Nicely
*Assistant Examiner* — Wilner Jean Baptiste
(74) *Attorney, Agent, or Firm* — Thomas J. Lavan

(57) ABSTRACT

A remapped extracted die is provided. The remapped extracted die includes an extracted die removed from a previous integrated circuit package. The extracted die includes a plurality of original bond pads having locations that do not correspond to desired pin assignments of a new package base and an interposer, bonded to the extracted die. The interposer includes first bond pads configured to receive new bond wires from the plurality of original bond pads, and second bond pads corresponding to desired pin assignments of the new package base, each individually electrically coupled to one of the first bond pads and configured to receive new bond wires from package leads or downbonds of the new package base.

20 Claims, 14 Drawing Sheets

Related U.S. Application Data application No. 13/283,293, filed on Oct. 27, 2011, now abandoned.

(51) Int. Cl.
*H01L 23/498* (2006.01)
*H01L 23/057* (2006.01)
*H01L 23/10* (2006.01)

(52) U.S. Cl.
CPC ........ *H01L 23/49838* (2013.01); *H01L 24/03* (2013.01); *H01L 24/48* (2013.01); *H01L 24/85* (2013.01); *H01L 24/45* (2013.01); *H01L 2224/03424* (2013.01); *H01L 2224/03464* (2013.01); *H01L 2224/04042* (2013.01); *H01L 2224/05124* (2013.01); *H01L 2224/05147* (2013.01); *H01L 2224/05554* (2013.01); *H01L 2224/05583* (2013.01); *H01L 2224/05624* (2013.01); *H01L 2224/05644* (2013.01); *H01L 2224/05655* (2013.01); *H01L 2224/05664* (2013.01); *H01L 2224/32225* (2013.01); *H01L 2224/45124* (2013.01); *H01L 2224/45144* (2013.01); *H01L 2224/45147* (2013.01); *H01L 2224/48227* (2013.01); *H01L 2224/48453* (2013.01); *H01L 2224/48463* (2013.01); *H01L 2224/48599* (2013.01); *H01L 2224/73265* (2013.01); *H01L 2224/85207* (2013.01); *H01L 2924/16152* (2013.01); *H01L 2924/19107* (2013.01)

(56) References Cited

U.S. PATENT DOCUMENTS

| | | | |
|---|---|---|---|
| 4,622,433 | A | 11/1986 | Frampton |
| 5,064,782 | A | 11/1991 | Nishiguchi |
| 5,219,794 | A | 6/1993 | Satoh |
| 5,243,756 | A | 9/1993 | Hamburgen et al. |
| 5,517,127 | A | 5/1996 | Bergeron |
| 5,598,031 | A | 1/1997 | Groover et al. |
| 5,783,464 | A | 7/1998 | Burns |
| 5,783,868 | A | 7/1998 | Galloway |
| 5,847,467 | A | 12/1998 | Wills |
| 5,936,758 | A | 8/1999 | Fisher et al. |
| 6,100,108 | A | 8/2000 | Mizuno et al. |
| 6,100,581 | A | 8/2000 | Wakefield et al. |
| 6,169,331 | B1 | 1/2001 | Manning |
| 6,429,028 | B1* | 8/2002 | Young .................... H01L 21/56 257/E21.502 |
| 6,472,725 | B1 | 10/2002 | Stroupe |
| 7,067,332 | B1 | 6/2006 | Chowdhury |
| 7,294,533 | B2 | 11/2007 | Lebonheur |
| 7,759,800 | B2 | 7/2010 | Rigg et al. |
| 7,883,880 | B1 | 2/2011 | Davila et al. |
| 8,421,227 | B2 | 4/2013 | Lin |
| 8,822,274 | B2* | 9/2014 | Suleiman ................ H01L 24/33 257/106 |
| 9,799,617 | B1 | 10/2017 | Curiel et al. |
| 9,870,968 | B2 | 1/2018 | Spory |
| 2001/0019176 | A1 | 9/2001 | Ahiko et al. |
| 2002/0084528 | A1 | 7/2002 | Kim et al. |
| 2002/0182782 | A1 | 12/2002 | Farnworth |
| 2003/0127423 | A1 | 7/2003 | Dlugokecki |
| 2004/0006150 | A1 | 1/2004 | Murray et al. |
| 2004/0040855 | A1 | 3/2004 | Batinovich |
| 2004/0056072 | A1* | 3/2004 | Chapman ............ B23K 20/005 228/180.5 |
| 2005/0057883 | A1 | 3/2005 | Bolken |
| 2005/0085578 | A1 | 4/2005 | Iguchi |
| 2005/0285250 | A1 | 12/2005 | Jeong |
| 2006/0068595 | A1 | 3/2006 | Seliger et al. |
| 2006/0166406 | A1 | 7/2006 | Lin |
| 2007/0007661 | A1 | 1/2007 | Burgess |
| 2007/0259470 | A1 | 11/2007 | Quenzer et al. |
| 2007/0295456 | A1 | 12/2007 | Gudeman |
| 2008/0124547 | A1 | 5/2008 | O et al. |
| 2008/0197469 | A1 | 8/2008 | Yang et al. |
| 2008/0230922 | A1 | 9/2008 | Mochizuki |
| 2009/0072413 | A1 | 3/2009 | Mahler |
| 2009/0085181 | A1 | 4/2009 | Advincula, Jr. |
| 2009/0151972 | A1 | 6/2009 | Potter |
| 2009/0160047 | A1* | 6/2009 | Otsuka .................... H01L 21/56 257/704 |
| 2010/0007367 | A1 | 1/2010 | Spielberger et al. |
| 2010/0079035 | A1 | 4/2010 | Matsuzawa et al. |
| 2010/0140811 | A1 | 6/2010 | Leal et al. |
| 2010/0200262 | A1 | 8/2010 | Mahapatra et al. |
| 2010/0246152 | A1 | 9/2010 | Lin et al. |
| 2010/0314754 | A1 | 12/2010 | Zhang |
| 2011/0215449 | A1 | 9/2011 | Camacho et al. |
| 2011/0298137 | A1 | 12/2011 | Pagaila et al. |
| 2012/0061814 | A1 | 3/2012 | Camacho et al. |
| 2012/0177853 | A1 | 7/2012 | Gruenwald |
| 2012/0217643 | A1 | 8/2012 | Pagaila |
| 2013/0207248 | A1 | 8/2013 | Bensoussan et al. |
| 2014/0252584 | A1 | 9/2014 | Spory |
| 2016/0181168 | A1 | 6/2016 | Spory |
| 2016/0181171 | A1 | 6/2016 | Spory |
| 2016/0225686 | A1* | 8/2016 | Spory .................... H01L 23/10 |
| 2018/0040529 | A1 | 2/2018 | Spory |
| 2018/0047685 | A1 | 2/2018 | Spory |
| 2018/0047700 | A1 | 2/2018 | Spory |
| 2018/0053702 | A1 | 2/2018 | Spory |
| 2018/0061724 | A1 | 3/2018 | Spory |

OTHER PUBLICATIONS

Official Action for U.S. Appl. No. 14/600,691, dated Aug. 10, 2015.
Official Action for U.S. Appl. No. 14/600,691, dated Feb. 19, 2016.
Official Action for U.S. Appl. No. 14/600,691, dated Jul. 29, 2016.
Official Action for U.S. Appl. No. 14/600,691, dated Dec. 27, 2016.
Notice of Allowance for U.S. Appl. No. 14/600,691, dated Jun. 6, 2017.
Official Action for U.S. Appl. No. 14/600,733, dated Apr. 17, 2015.
Official Action for U.S. Appl. No. 14/600,733, dated Sep. 9, 2015.
Official Action for U.S. Appl. No. 14/600,733, dated May 9, 2016.
Official Action for U.S. Appl. No. 14/600,733, dated Aug. 23, 2016.
Official Action for U.S. Appl. No. 14/600,733, dated Dec. 2, 2016.
Notice of Allowance for U.S. Appl. No. 14/600,733, dated Oct. 5, 2017.
Official Action for U.S. Appl. No. 15/088,822, dated Mar. 24, 2017.
Notice of Allowance for U.S. Appl. No. 15/088,822, dated Aug. 15, 2017.
Official Action for U.S. Appl. No. 13/623,603, dated Jan. 16, 2018.
Notice of Allowance for U.S. Appl. No. 14/142,823, dated Nov. 30, 2017.
Notice of Allowance for U.S. Appl. No. 14/142,823, dated Feb. 16, 2018.
Notice of Allowance for U.S. Appl. No. 15/088,822, dated Nov. 13, 2017.
Getters—molecular scavengers for packaging, Dr. Ken Gilleo and Steve Corbett, HDI Jan. 2001, www.hdi-online.com, 4 pages.
Cookson Group STAYDRY SD1000 High Temperature Moisture Getter data sheet, Cookson Group, May 30, 2011, 1 page.
Wikipdia "Getter", retrieved May 30, 2011, http://en.wikipedia.org/wiki/Getter.
Wikipdia "Kirkendall effect", retrieved Jul. 5, 2011, http://en.wikipedia.org/wiki/Kirkendall effect.
Flip Chips dot com, Tutorial 72—Mar. 2007, Redistribution Layers, article by George A. Riley, PhD, Flipchips dot com website, downloaded Dec. 18, 2011: http://www.flipchips.com/tutorial72.html.
MIT article "Liquid Metal Printer Lays Electronic Circuits on Paper, Plastic, and even Cotton", downloaded from MIT Technology Review Nov. 22, 2013, http://www.technologyreview.com/view/521871/liquid-metal-printer-lays-electronic-circuits-on-paper-plastic-and-even-cotton/.

(56) References Cited

OTHER PUBLICATIONS sPRO 125 and sPRO 250 Direct Metal SLM Production Printer datasheet, 3DSystems, Part No. 70743, Issue Date Apr. 10 2012.
Wikipedia "3D Printing" reference, downloaded Jan. 12, 2015.
Wikipedia "Screen printing" reference, downloaded Jan. 12, 2015.
Wikipedia "Ball Bonding", downloaded Apr. 11, 2016.
Solid State Technology "The back-end process: Step 7—Solder bumping step by step", by Deborah S. Patterson, http://electroiq.com/blog/2001/07/the-back-end-process-step-7-solder-bumping-step-by-step/, downloaded Apr. 11, 2016.
Official Action for U.S. Appl. No. 13/623,603, dated Dec. 9, 2014.
Official Action for U.S. Appl. No. 13/623,603, dated Apr. 16, 2015.
Official Action for U.S. Appl. No. 13/623,603, dated Aug. 14, 2015.
Official Action for U.S. Appl. No. 13/623,603, dated Apr. 29, 2016.
Official Action for U.S. Appl. No. 13/623,603, dated Aug. 24, 2016.
Official Action for U.S. Appl. No. 13/623,603, dated Apr. 11, 2017.
Official Action for U.S. Appl. No. 13/785,959, dated Jan. 5, 2015.
Official Action for U.S. Appl. No. 13/785,959, dated Apr. 16, 2015.
Official Action for U.S. Appl. No. 14/142,823, dated Jan. 5, 2015.
Official Action for U.S. Appl. No. 14/142,823, dated May 11, 2015.
Official Action for U.S. Appl. No. 14/142,823, dated Oct. 9, 2015.
Official Action for U.S. Appl. No. 14/142,823, dated Feb. 29, 2016.
Official Action for U.S. Appl. No. 14/142,823, dated Jul. 28, 2016.
Official Action for U.S. Appl. No. 14/142,823, dated Mar. 17, 2017.
Official Action for U.S. Appl. No. 15/792,414, dated Mar. 19, 2018.
Notice of Allowance for U.S. Appl. No. 15/792,414, dated May 14, 2018.
Official Action for U.S. Appl. No. 15/792,225, dated Apr. 30, 2018.
Official Action for U.S. Appl. No. 15/792,381, dated Apr. 16, 2018.

\* cited by examiner

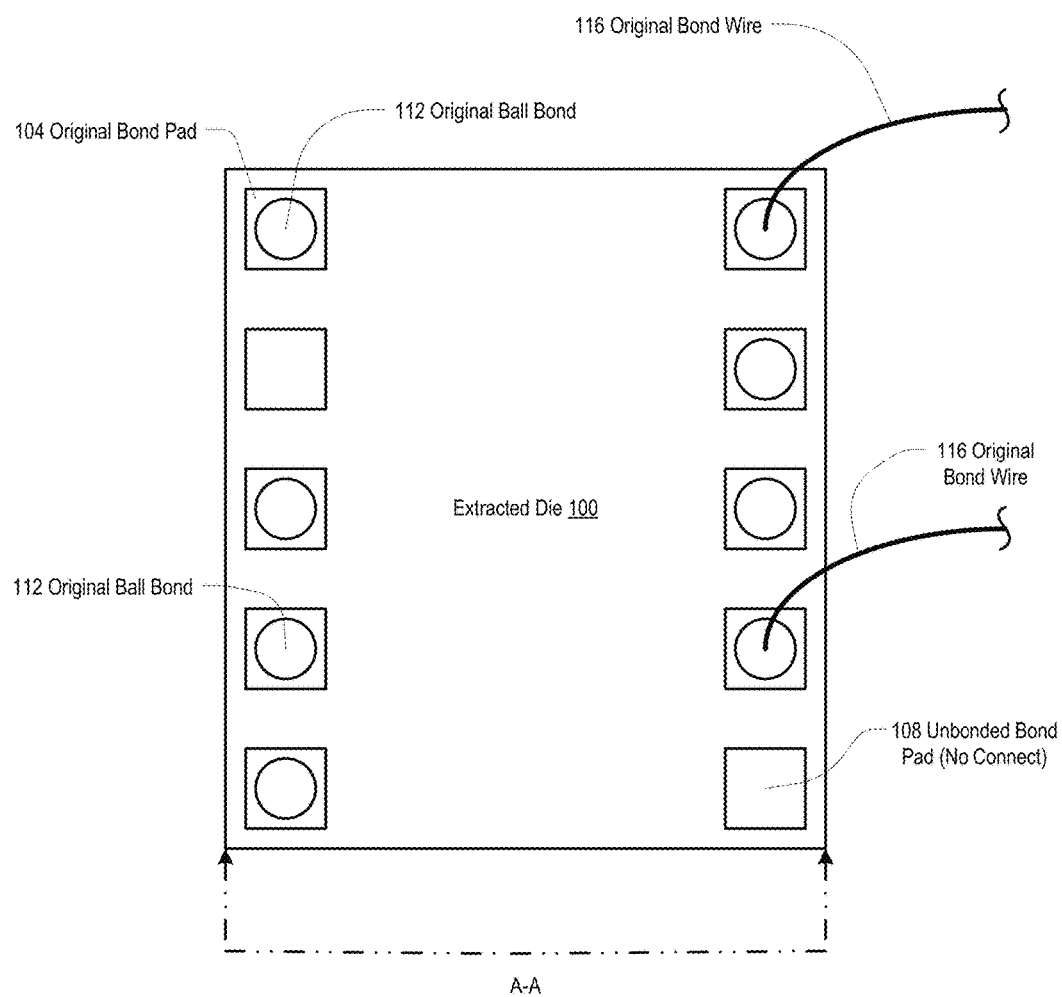
Fig. 1 Extracted Die with Original Bond Pads, Original Ball Bonds, and Original Bond Wires

*Fig. 2A Extracted Die Section A-A*
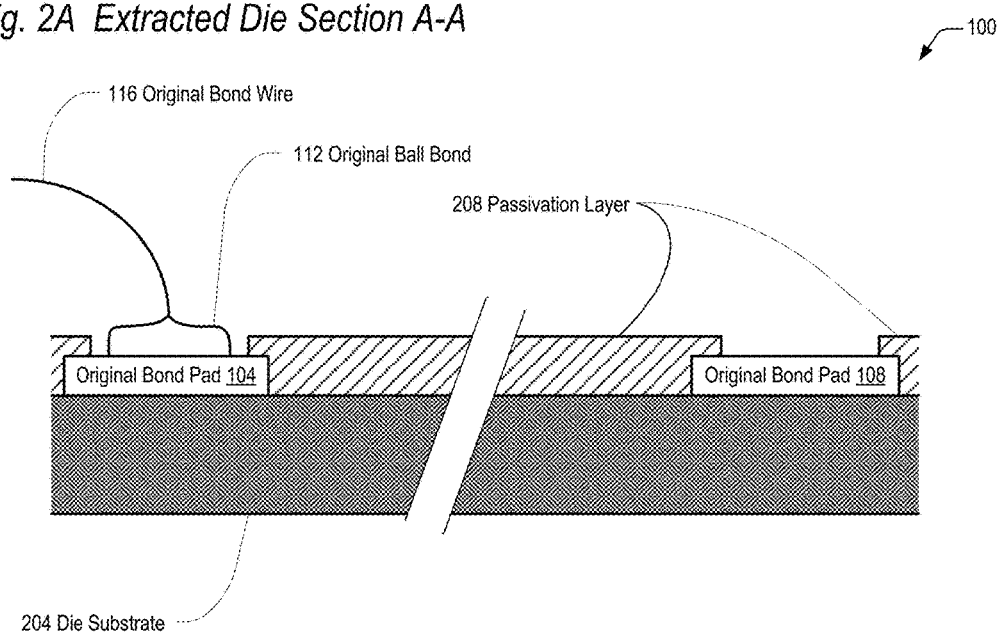
*Fig. 2B Modified Extracted Die Section A-A After Original Ball Bond Removal*
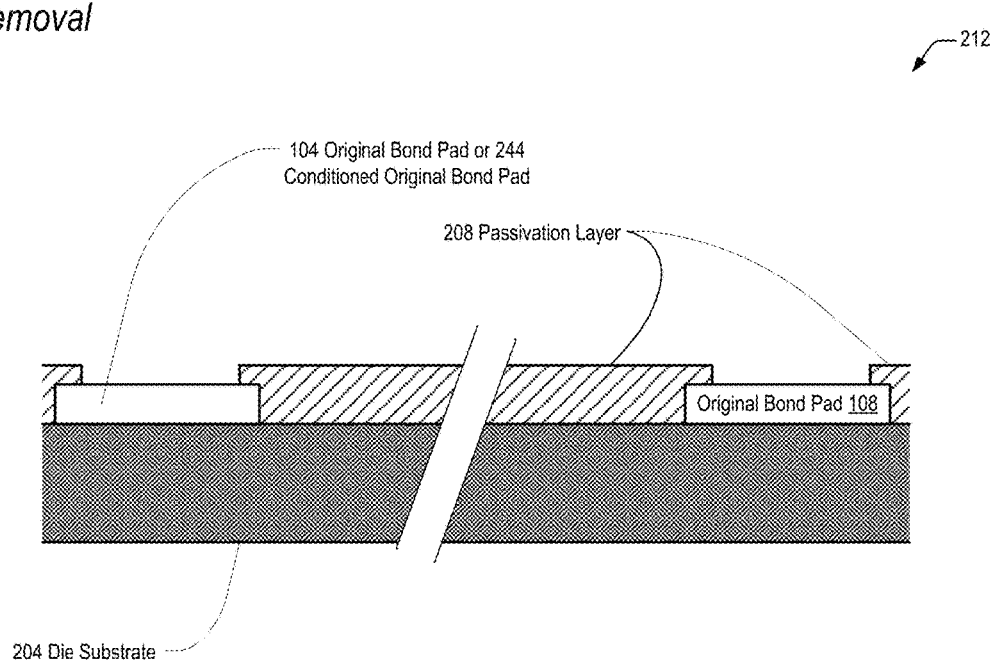

Fig. 2C  Electroless Nickel Layer Application Section A-A
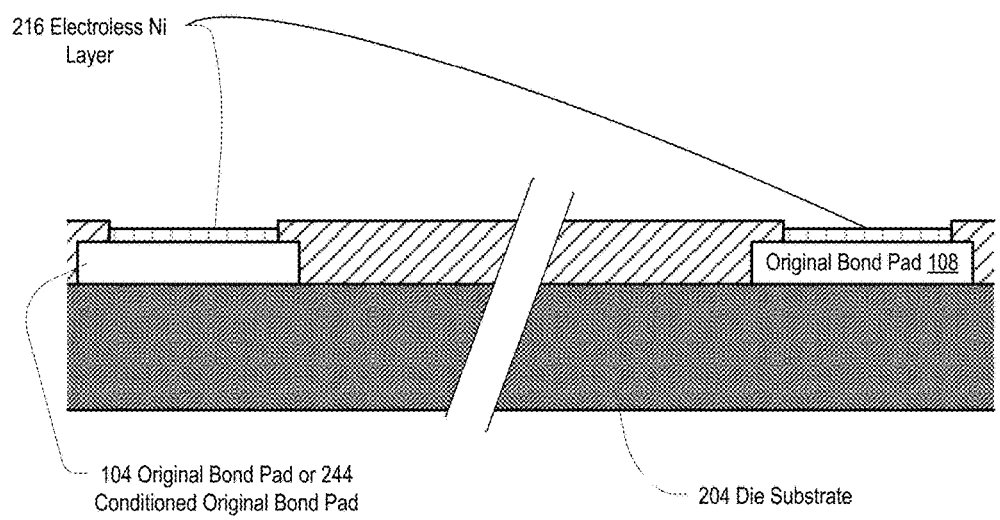
Fig. 2D  Electroless Palladium Layer Section A-A
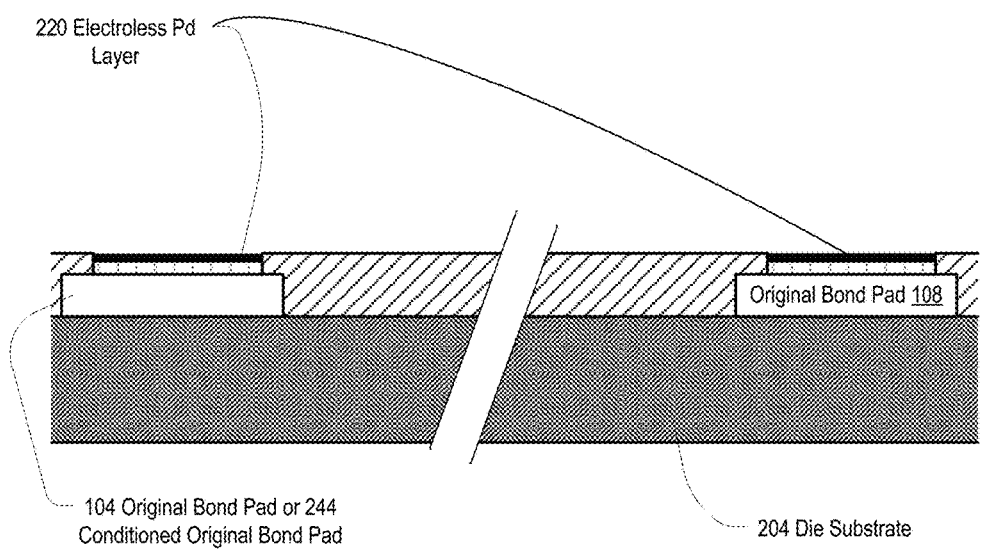

Fig. 2E Immersion Gold Layer Application Section A-A
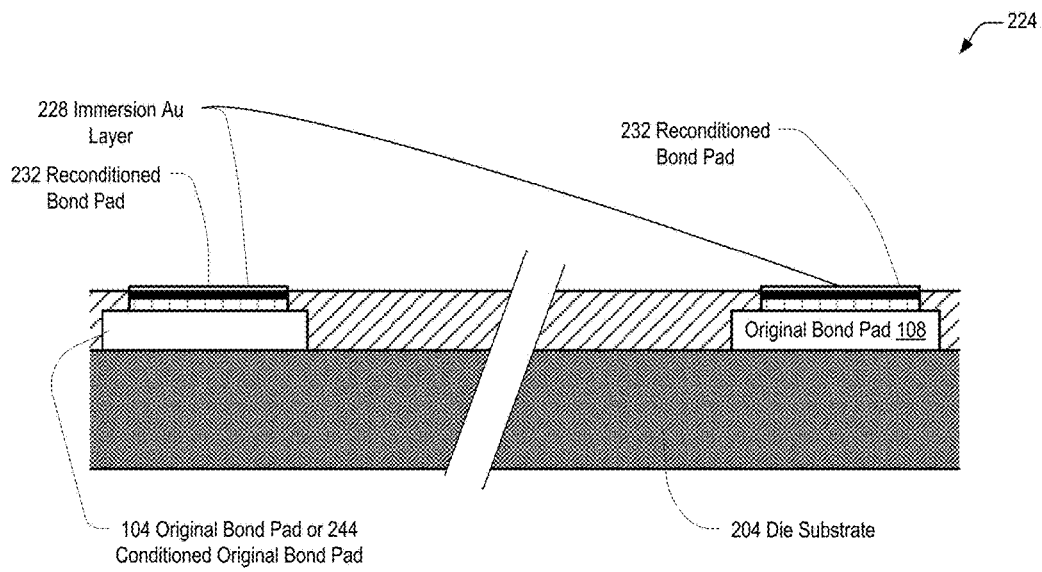
Fig. 2F New Bond Wires and Ball Bonds Section A-A
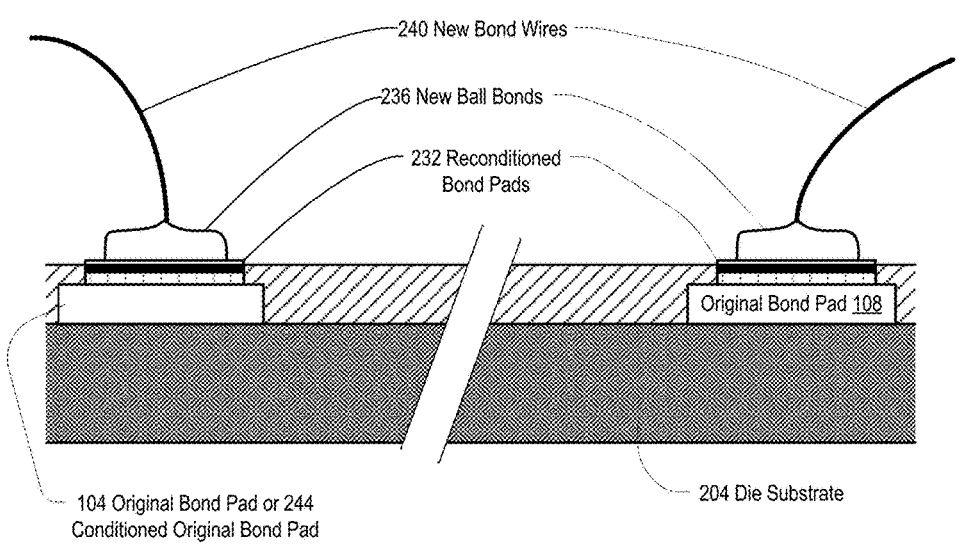

Fig. 3A Extracted Die Section A-A After Rebonding Process
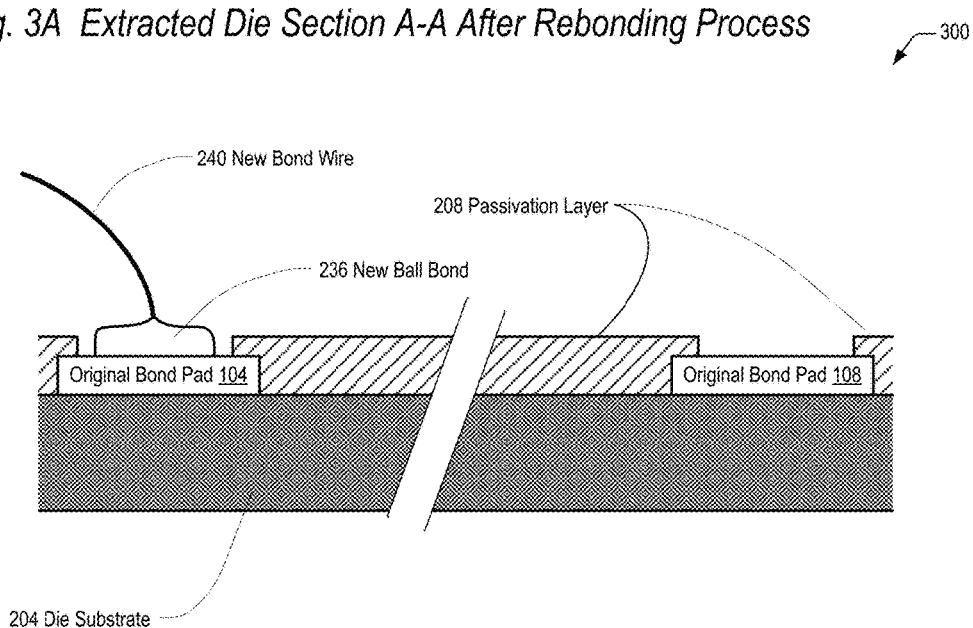
Fig. 3B Extracted Die Section A-A After Rebonding Process
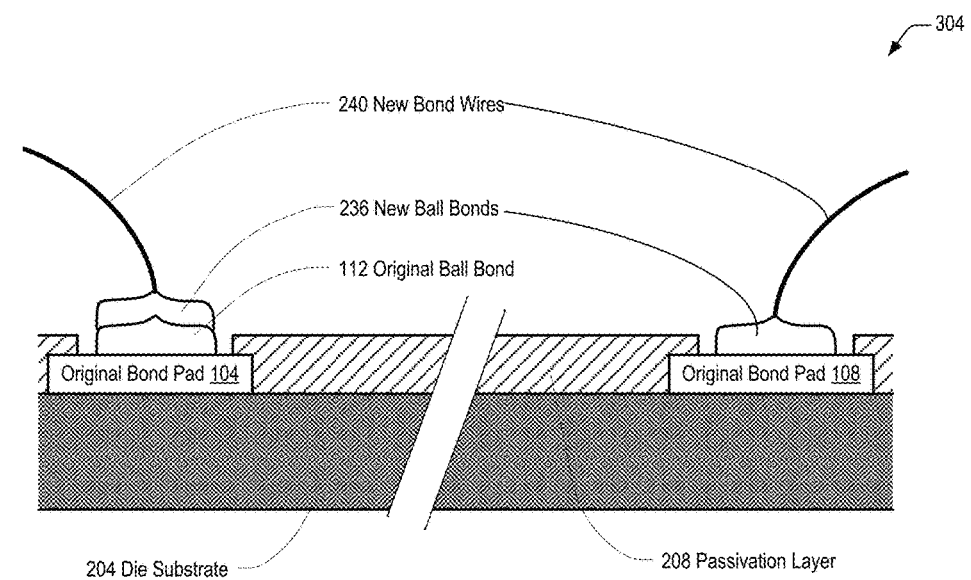

Fig. 4A Assembled New Package Base With New Bond Wires
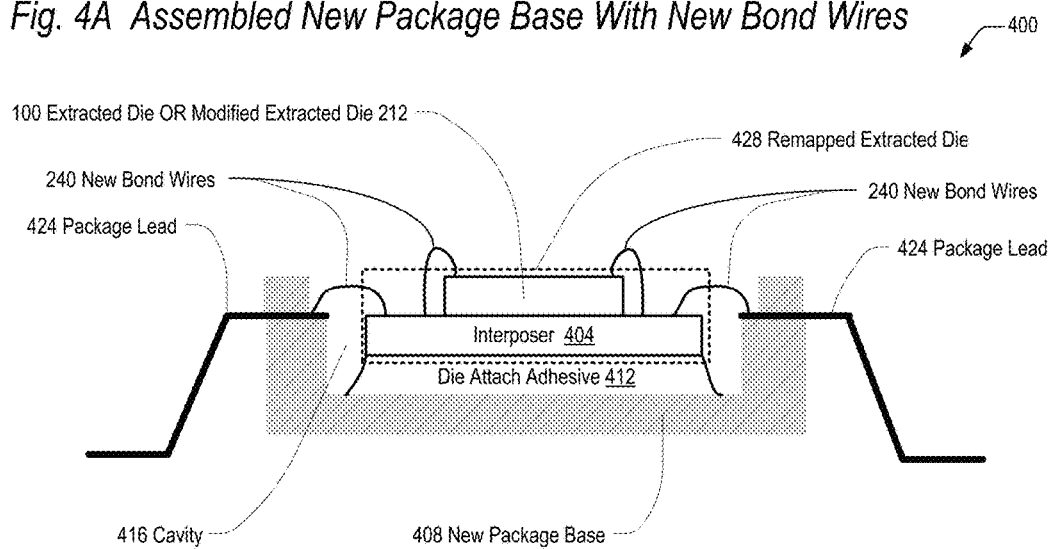
Fig. 4B Assembled Non-Hermetic Package With Extracted Die
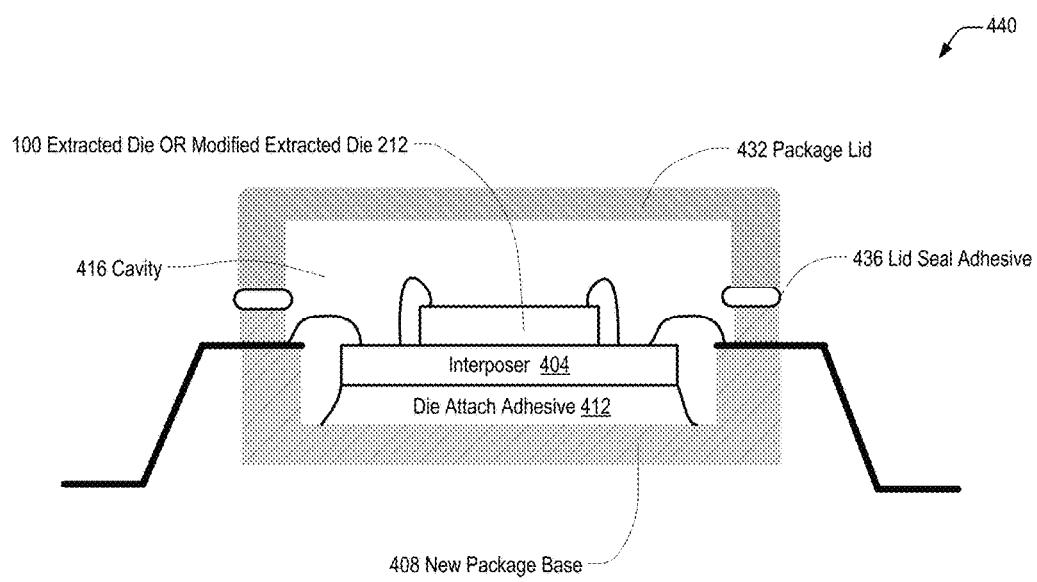

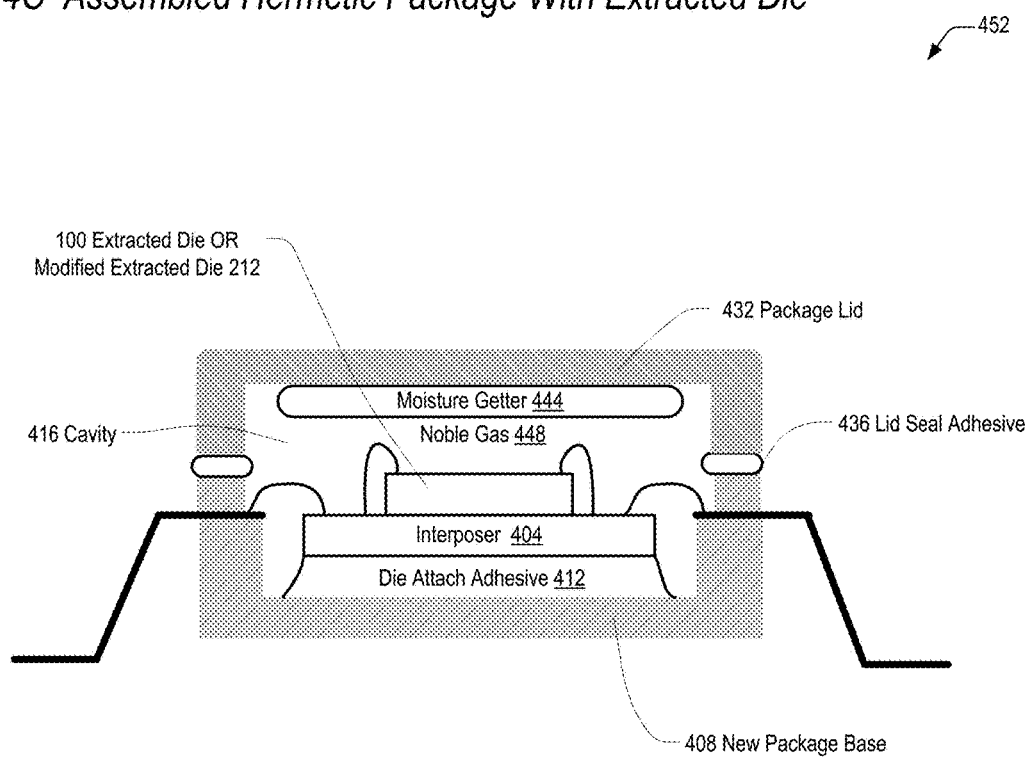
Fig. 4C Assembled Hermetic Package With Extracted Die

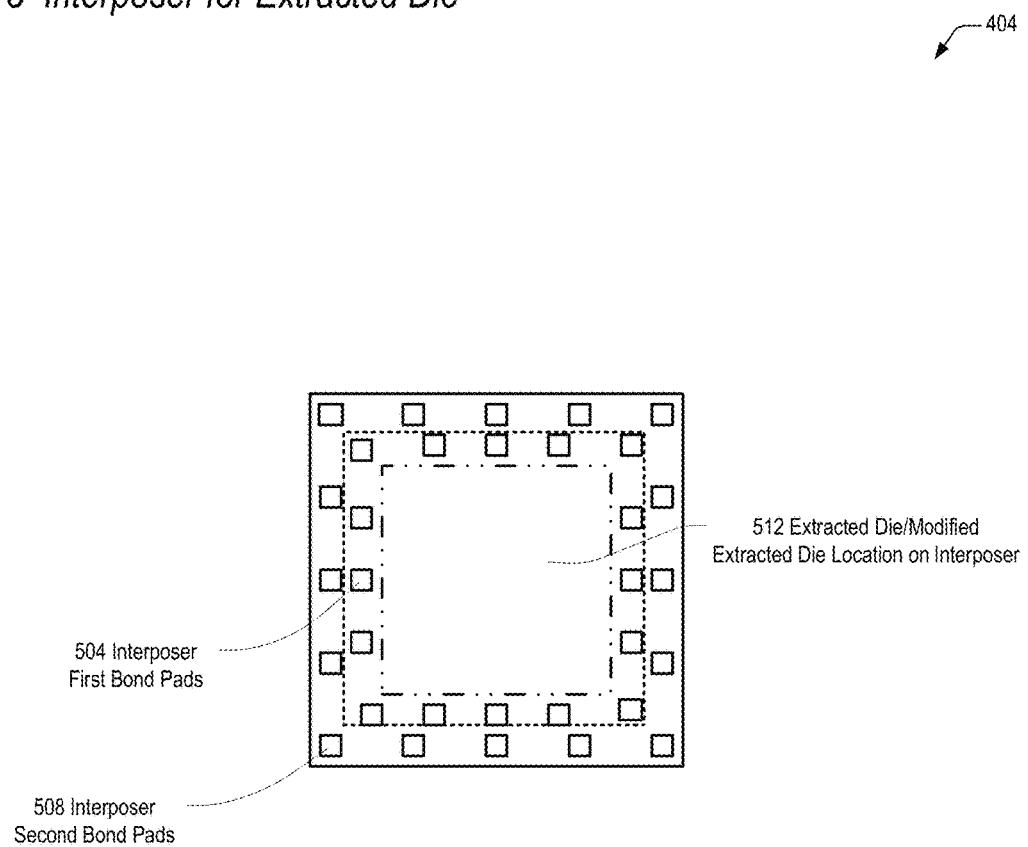
Fig. 5 Interposer for Extracted Die

Fig. 6A Top View of New Package Base Before Wire Bonding
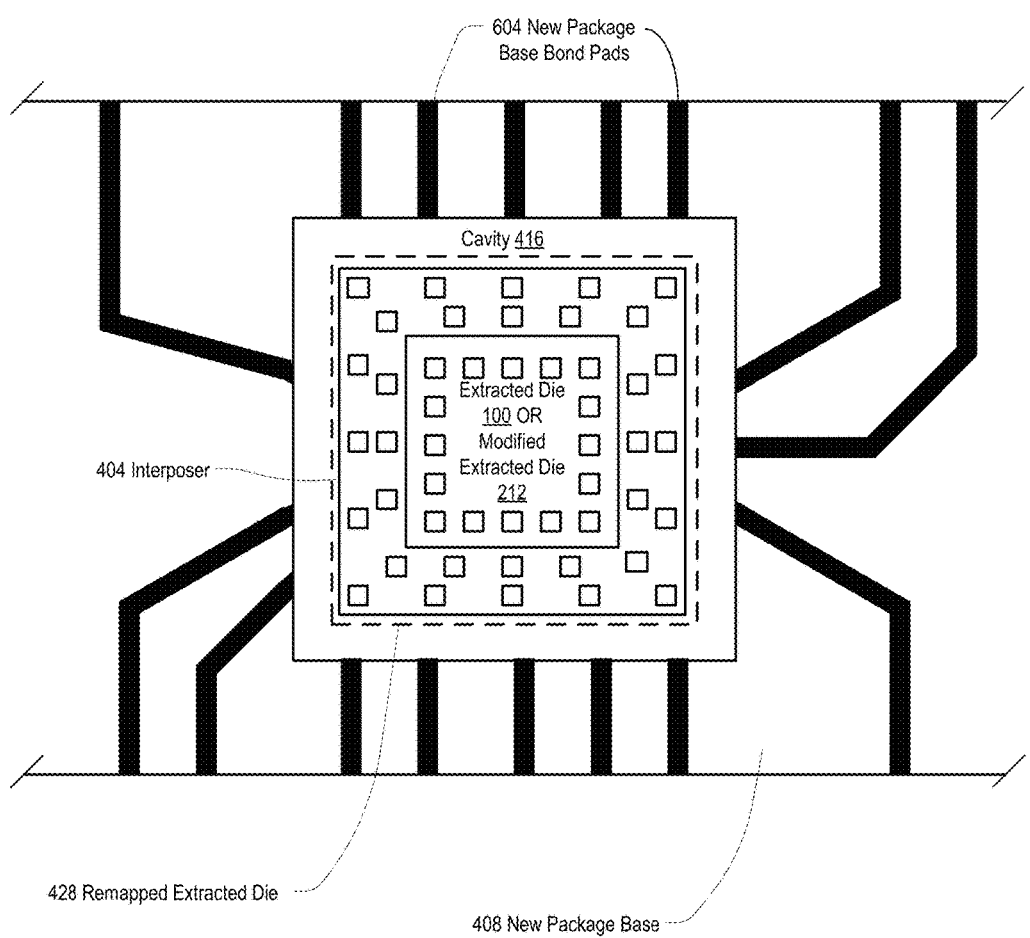

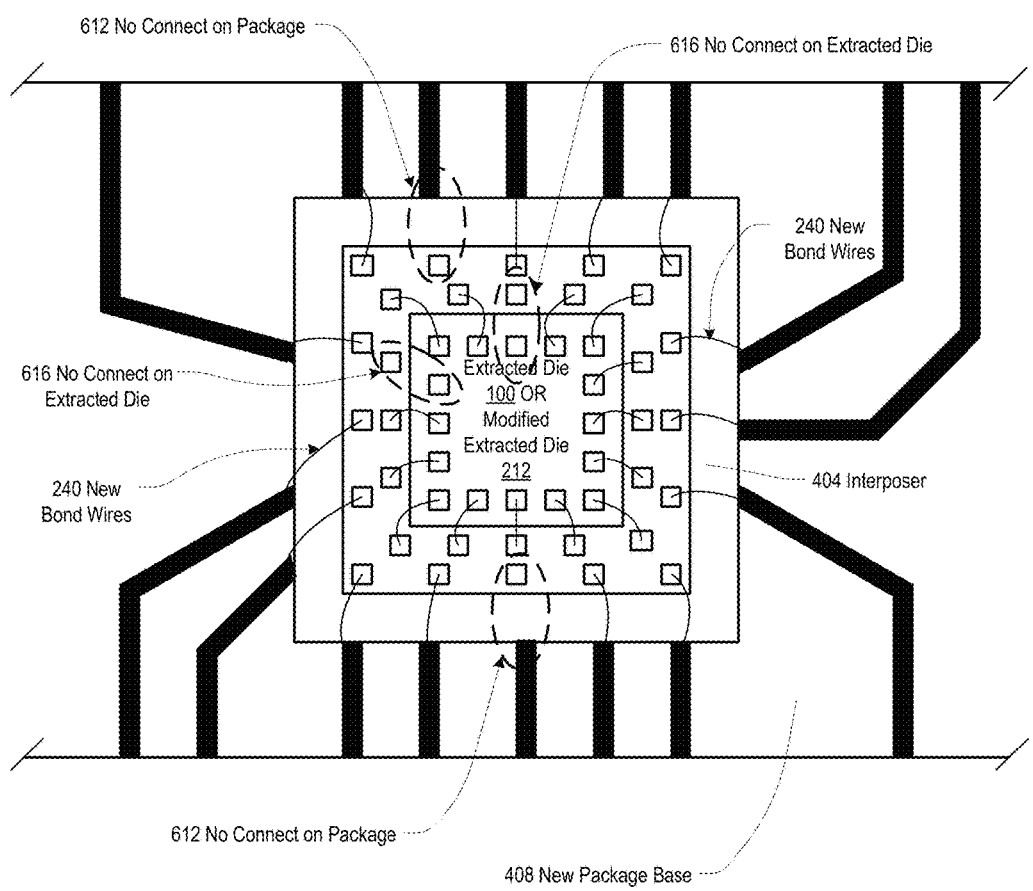
Fig. 6B Top View of New Package Base After Wire Bonding

*Fig. 7A Assembly Method for Packaged Integrated Circuit*
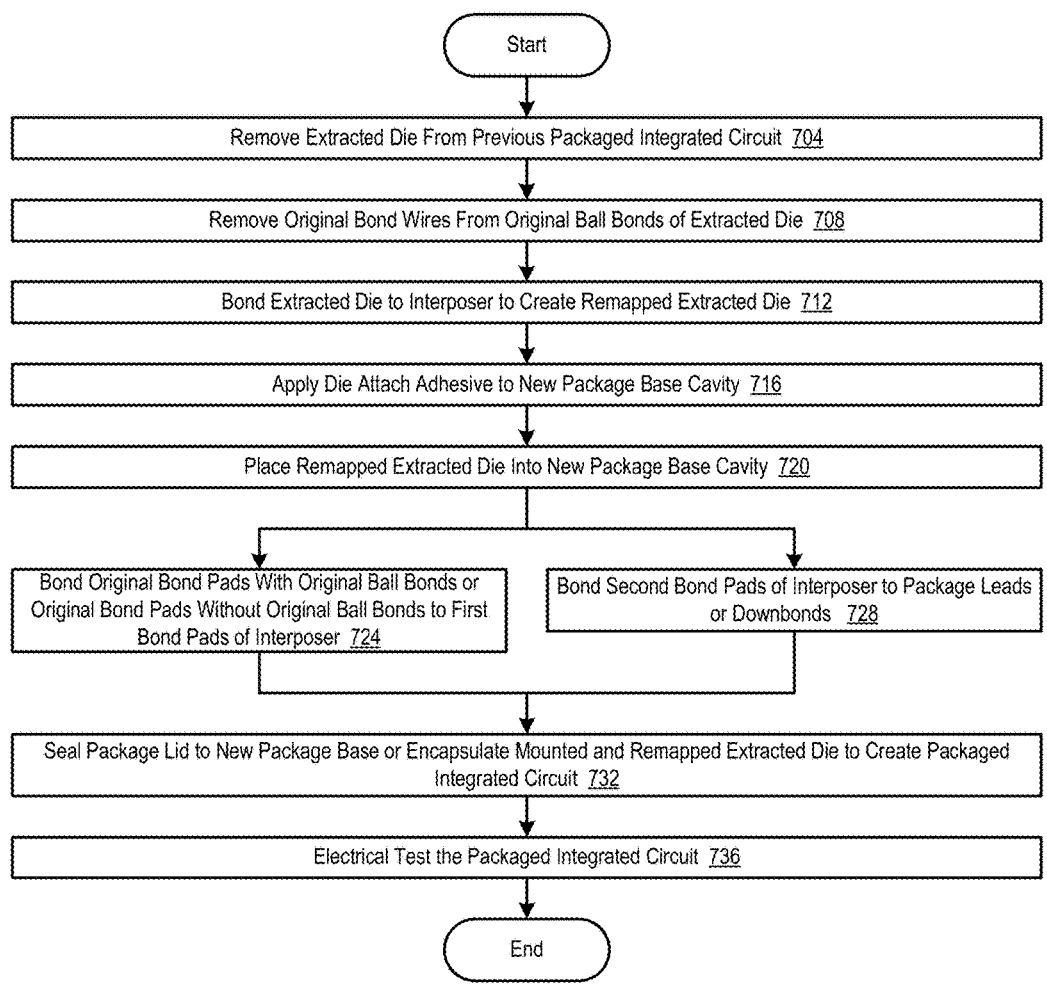

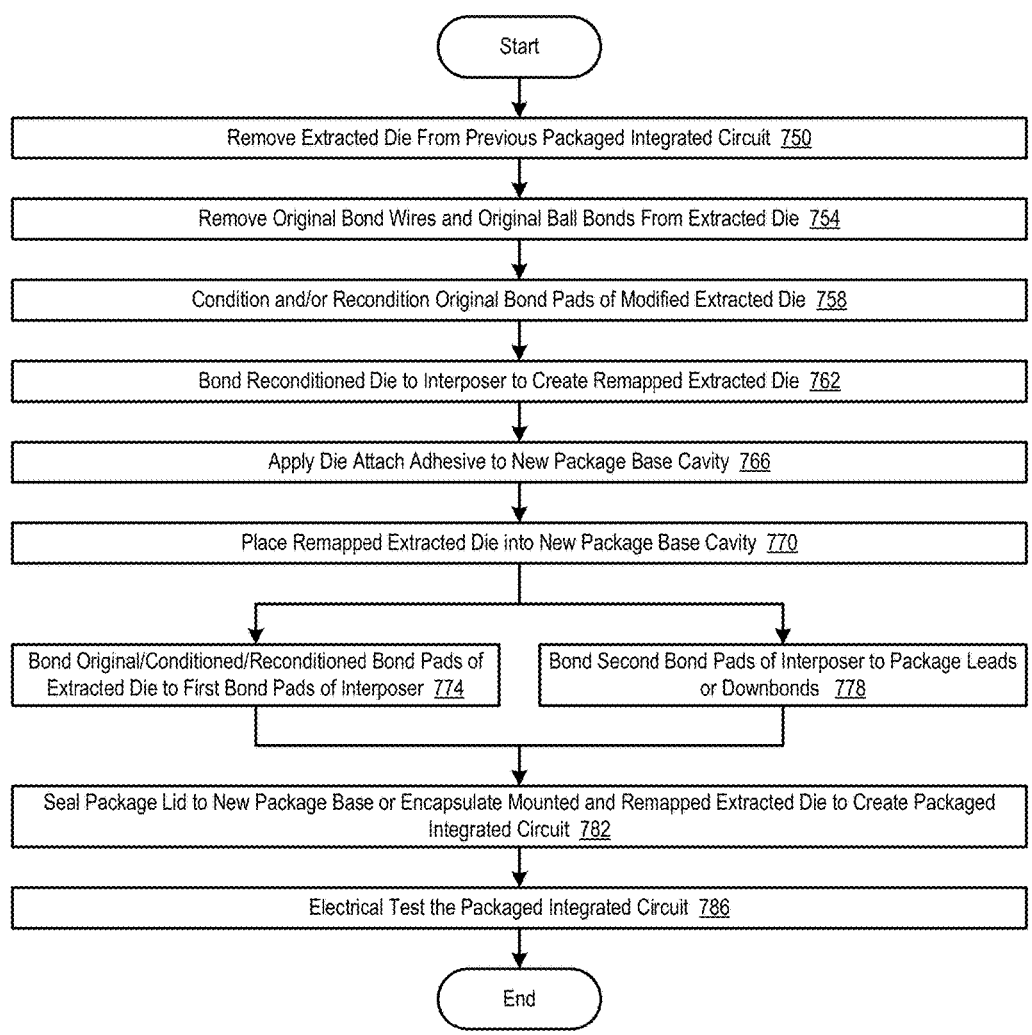
Fig. 7B Assembly Method for Packaged Integrated Circuit

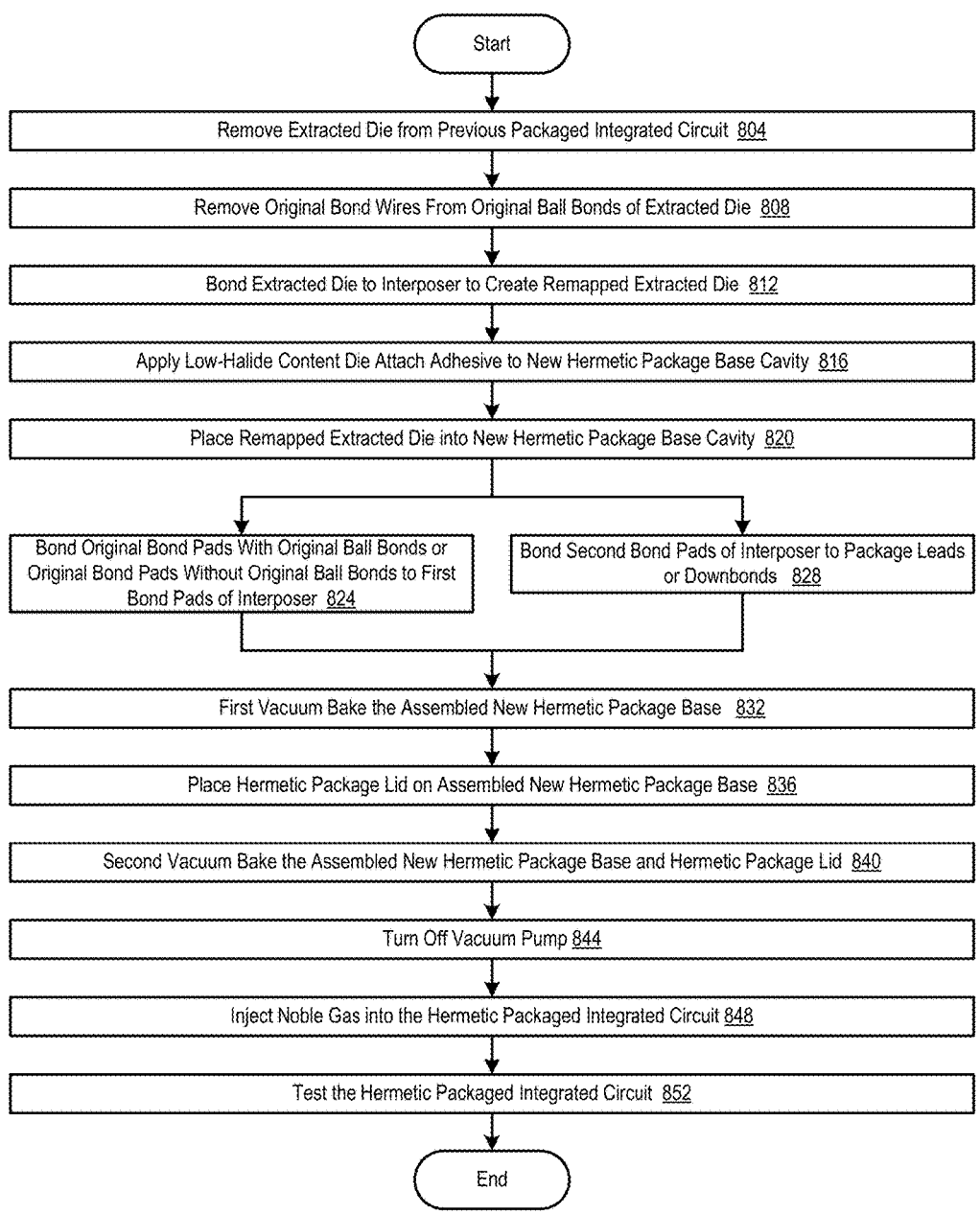
Fig. 8a Assembly Method for Hermetic Packaged Integrated Circuit

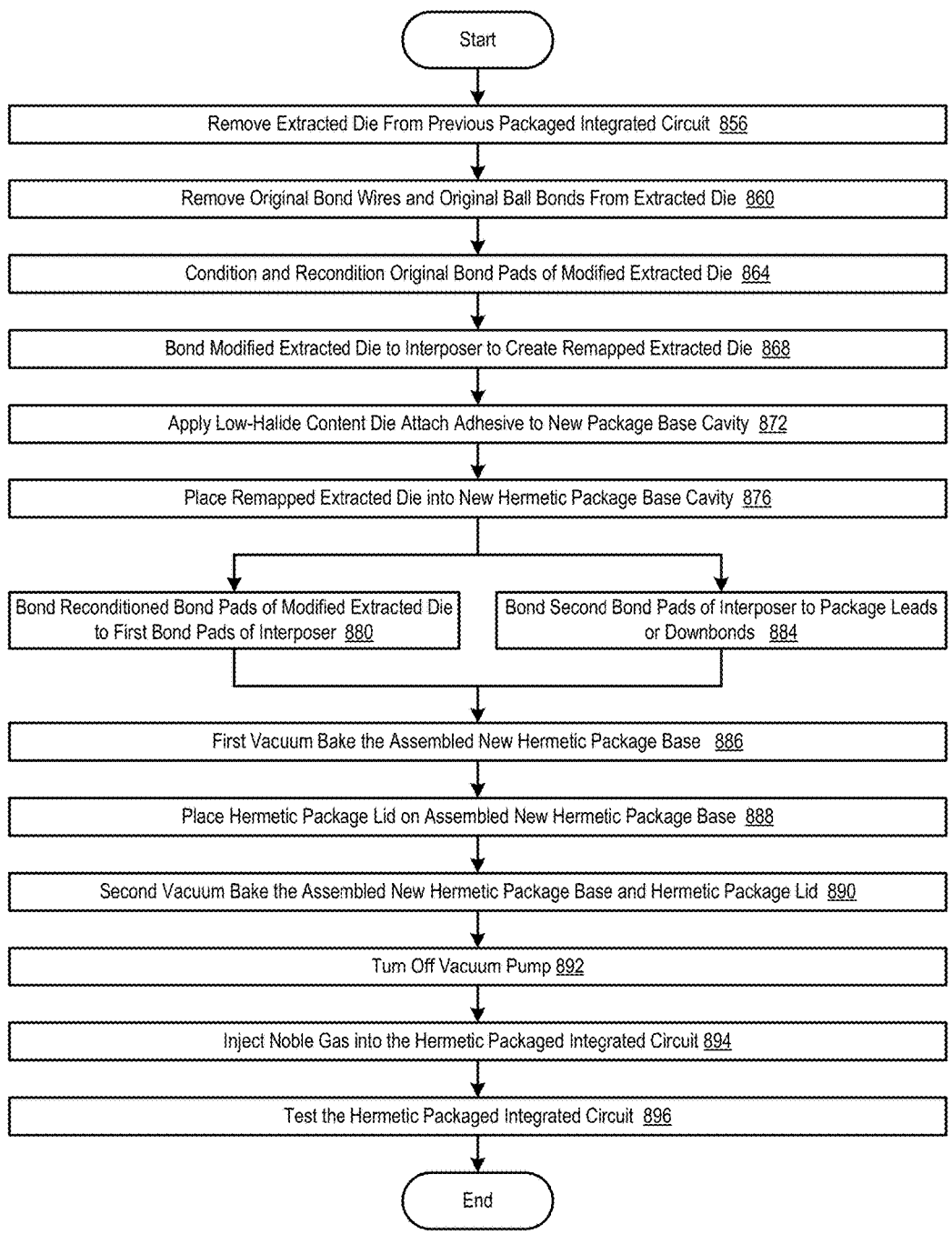
Fig. 8B Assembly Method for Hermetic Packaged Integrated Circuit

REMAPPED PACKAGED EXTRACTED DIE

CROSS REFERENCE TO RELATED APPLICATION(S)

This application is a Continuation-in-Part of pending U.S. application Ser. No. 13/623,603, filed Sep. 20, 2012, entitled ENVIRONMENTAL HARDENING TO EXTEND OPERATING LIFETIMES OF INTEGRATED CIRCUITS AT ELEVATED TEMPERATURES, which is hereby incorporated by reference for all purposes, which is a Continuation of U.S. application Ser. No. 13/283,293 filed Oct. 27, 2011, entitled ENVIRONMENTAL HARDENING TO EXTEND OPERATING LIFETIMES OF INTEGRATED CIRCUITS AT ELEVATED TEMPERATURES, now abandoned.

FIELD

The present invention is directed to integrated circuit packaging. In particular, the present invention is directed to methods and apparatuses for utilizing extracted dice in new packaged integrated circuits.

BACKGROUND

Integrated circuits are available in many different packages, technologies, and sizes. Most integrated circuits are available in plastic packages, which are generally intended for commercial operating environments at a low cost. Commercial operating environments have a specified operating range from 0° C. to 70° C. Integrated circuits for military applications have historically been packaged in either metal or ceramic hermetic packages, which are able to work reliably in more demanding environments than commercial integrated circuits. Military operating environments have a specified operating range from −55° C. to 125° C. In order to save costs, the military has purchased integrated circuits through COTS (Commercial Off-The-Shelf) programs. However, these components are generally commercial grade components in plastic packages, and not intended for demanding environments requiring the broader temperature range reliability and durability of ceramic and metal hermetically packaged integrated circuits.

Depending on size and complexity, integrated circuits are available in a wide range of packages. Although many older integrated circuits were packaged using through-hole technology packages, surface mount packages have dominated over the past several decades. Surface mount packages generally have circuit density, cost, and other advantages over through-hole integrated circuits. Examples of through-hole packages include DIP (dual-in-line plastic) and PGA (pin grid array). Examples of surface mount packages include SOIC (small-outline integrated circuit) and PLCC (plastic leaded chip carrier).

Integrated circuit packages generally consist of a semiconductor die placed within a package base and bonded to the base with a suitable die attach adhesive. In conventional technology, the die is electrically attached to a lead frame of the package base with discrete bond wires, which connect individual pads of the die with package leads. In most cases, the bond wires are gold, but in other environments can be copper or aluminum. Specialized equipment is required to attach the bond wires to the die pads the lead frame. Once all of the bond wires are attached, the package lid is bonded to the package base and the integrated circuit can be tested.

SUMMARY

The present invention is directed to solving disadvantages of the prior art. In accordance with embodiments of the present invention, a remapped extracted die is provided. The remapped extracted die includes an extracted die which includes a plurality of original bond pads having locations that do not correspond to desired pin assignments of a new package base and extracted from a previous integrated circuit package, and an interposer, bonded to the extracted die. The interposer includes first bond pads configured to receive new bond wires from the plurality of original bond pads, and second bond pads corresponding to desired pin assignments of the new package base, each individually electrically coupled to one of the first bond pads and configured to receive new bond wires from package leads or downbonds of the new package base.

In accordance with another embodiment of the present invention, a packaged integrated circuit is provided. The packaged integrated circuit includes an extracted die removed from a previous packaged integrated circuit, and a new package base. The new package base includes package leads. The packaged integrated circuit also includes an interposer, bonded to the extracted die and the new package base. The interposer includes first and second bond pads. The packaged integrated circuit further includes new bond wires, provided between the extracted die and first bond pads and between the second bond pads and package leads or downbonds to the new package base, and a package lid sealed to the new package base.

In accordance with a further embodiment of the present invention, a new hermetic packaged integrated circuit is provided. The new hermetic packaged integrated circuit includes a new hermetic package base, including a cavity and package leads, and a remapped extracted die, secured within the cavity. The remapped extracted die includes an extracted die removed from a previous packaged integrated circuit and an interposer, bonded to the extracted die and the new hermetic package base. The extracted die includes no original ball bonds or bond wires present on original bond pads, no residues or oxides present on original bond pads, and one or more reconditioned bond pads. Each of the one or more reconditioned bond pads includes a nickel layer covering an original bond pad, a palladium layer covering the nickel layer, and a gold layer covering the palladium layer. The interposer includes first bond pads electrically coupled to second bond pads. The new hermetic packaged integrated circuit also includes new bond wires, bonded between the reconditioned bond pads and the first bond pads and between the second bond pads and the package leads or downbonds, and a package lid sealed to the new hermetic package base.

An advantage of the present invention is that it allows a packaged integrated circuit to be produced even if the die or wafers needed are out of production. Sometimes, the only way to obtain new packaged integrated circuits is to reuse extracted dice from previous packaged integrated circuits.

Another advantage of the present invention is it provides a way to repackage an extracted die for a different package and pinout than the extracted die was originally packaged for. There is no limit to the pinouts that may be thusly created, and by using different interposers, extracted dice may be utilized in many different packages and pinouts.

Additional features and advantages of embodiments of the present invention will become more readily apparent from the following description, particularly when taken together with the accompanying drawings.

BRIEF DESCRIPTION OF THE DRAWINGS

FIG. 1 is a diagram illustrating an extracted die with original bond pads, original ball bonds, and original bond wires in accordance with embodiments of the present invention.

FIG. 2A is an illustration depicting a section A-A of an extracted die in accordance with embodiments of the present invention.

FIG. 2B is an illustration depicting a section A-A of a modified extracted die after original ball bond removal in accordance with embodiments of the present invention.

FIG. 2C is an illustration depicting a section A-A of an extracted die with electroless Nickel layer application in accordance with embodiments of the present invention.

FIG. 2D is an illustration depicting a section A-A of an extracted die with an electroless Palladium layer in accordance with embodiments of the present invention.

FIG. 2E is an illustration depicting a section A-A of an extracted die with an immersion Gold layer in accordance with embodiments of the present invention.

FIG. 2F is an illustration depicting a section A-A of an extracted die with new bond wires and new ball bonds in accordance with embodiments of the present invention.

FIG. 3A is an illustration depicting a section A-A of an extracted die after a first rebonding process in accordance with embodiments of the present invention.

FIG. 3B is an illustration depicting a section A-A of an extracted die after a second rebonding process in accordance with embodiments of the present invention.

FIG. 4A is an illustration depicting an assembled new package base with new bond wires in accordance with embodiments of the present invention.

FIG. 4B is an illustration depicting an assembled non-hermetic integrated circuit package with an extracted die in accordance with embodiments of the present invention.

FIG. 4C is an illustration depicting an assembled hermetic integrated circuit package with an extracted die in accordance with embodiments of the present invention.

FIG. 5 is an illustration depicting an interposer for an extracted die in accordance with embodiments of the present invention.

FIG. 6A is an illustration depicting a top view of a new package base before wire bonding in accordance with embodiments of the present invention.

FIG. 6B is an illustration depicting a top view of a new package base after wire bonding in accordance with embodiments of the present invention.

FIG. 7A is a flowchart illustrating an assembly method for a packaged integrated circuit in accordance with a first embodiment of the present invention.

FIG. 7B is a flowchart illustrating an assembly method for a packaged integrated circuit in accordance with a second embodiment of the present invention.

FIG. 8A is a flowchart illustrating an assembly method for a hermetic packaged integrated circuit in accordance with a third embodiment of the present invention.

FIG. 8B is a flowchart illustrating an assembly method for a hermetic packaged integrated circuit in accordance with a fourth embodiment of the present invention.

DETAILED DESCRIPTION

Integrated circuits are most commonly packaged in plastic packages using dice with Aluminum (Al) bond pads and Gold (Au) bond wires from the bond pads to the package leads and package cavity. Bond wires are attached to bond pads and package leads using thermosonic bonding, wedge bonding, or other processes well understood in the art.

In some cases, bare dice and wafers are generally not available. It is therefore highly desirable to obtain dice from previously packaged integrated circuits. Integrated circuit dice are then extracted from an existing package—usually plastic—and repackaged into a suitable package according to the component needs of the market. These extracted dice retain the original Au ball bonds on the Al die pads. In some cases, extracted dice are repackaged into commercial plastic packages. In other cases, often military or environmentally hardened applications, extracted dice are repackaged into hermetic ceramic or metal packages.

The present invention is directed to integrated circuits and methods for removing extracted dice from a previous package and repackaging into a different package, generally with a different pinout from the previous package.

Referring now to FIG. 1, an extracted die 100 with original bond pads 104, 108, original ball bonds 112, and original bond wires 116 in accordance with embodiments of the present invention is shown. Extracted die 100 is an individual semiconductor die or substrate, and is usually fabricated in suitable technologies including Silicon (Si) and Gallium Arsenide (GaAs). Extracted die 100 may have a single die or multiple interconnected dice. Regardless whether extracted die 100 includes a single die or multiple interconnected dice, die circuitry is connected to original bond pads 104, 108 of the extracted die 100. Original bond pads 104, 108 are most commonly aluminum (Al) or copper (Cu) alloy pads, although the present invention is not limited to any particular bond pad 104, 108, 504, 508 or bond wire 116, 240 metallurgy.

Each previously used original bond pad 104 of the extracted die 100 may have an original ball bond 112 present, although one or more unbonded bond pads 108 may not have an original ball bond 112 present. In some cases, this is due to a no-connect in the previous integrated circuit package. When the extracted die 100 was present in whatever previous integrated circuit package was used for the extracted die 100, original bond wires 116 connected each of the original ball bonds 112 to a lead or a downbond of the previous integrated circuit package. FIG. 1 illustrates an exemplary extracted die 100 after it has been removed from the previous integrated circuit package. Therefore, some original bond wires 116 have been removed and some original bond wires 116 remain. In current technology packaged integrated circuits, the vast majority of bond wire interconnections are made with Gold (Au) thermosonic ball bonding. Extracted dice 100 are in the state shown in FIG. 1 at the beginning of the process of the present invention. Section A-A is used in FIGS. 2A-2F and 3A, 3B to illustrate a side view of extracted die 100.

Referring now to FIG. 2A, a diagram illustrating a section A-A of an extracted die 100 in accordance with embodiments of the present invention is shown. In order to show the assembly of the preferred embodiment of the present invention, a side view of the extracted die 100 is provided.

Extracted die 100 includes a die substrate 204 including various metallization layers known in the art. On the surface of the die substrate 204 are one or more original bond pads 104, 108. A passivation layer 208 is applied over the die substrate 204 in order to protect the circuits of the die substrate 204, and the passivation layer 208 is relieved at each of the original bond pads 104, 108 in order to provide bonding access.

Where original ball bonds 112 and original bond wires 116 are applied to original bond pads 104, 108, the original bond pads are original bond pads 104. Where no original ball bonds 112 and original bond wires 116 are applied to original bond pads 104, 108, the original bond pads are original bond pads 108. FIG. 2A illustrates the point at which the extracted die 100 has been removed from its' original package and one or more original ball bonds 112 and original bond wires 116 are present.

Referring now to FIG. 2B, a diagram illustrating a section A-A of a modified extracted die 212 after original ball bond 112 and original bond wire 116 removal in accordance with embodiments of the present invention is shown. A modified extracted die is an extracted die 100 with the original ball bonds 108 and original bond wires 116 removed. Although in some embodiments original gold ball bonds 112 may be removed by mechanical means, in most cases it is preferable to use chemical removal means by known processes. FIG. 2B illustrates the original ball bond 112 and original bond wire 116 removed from the original bond pad 104. Not shown in FIG. 2B is that after removing the original ball bond 112 and original bond wire 116, some amount of intermetallic residue and/or oxides will be present on the original bond pads 104. This generally requires removal to make sure there are no impurities, residues, or oxides on the original bond pads 104, 108. Removal is preferably performed using a mild acid wash. The acid wash is followed by an acid rinse that removes surface oxides present on the original bond pads 104, 108. For plating on an Aluminum surface, a zincate process is used to etch away a very fine layer of Aluminum from the original bond pads 104, 108 and redeposit a layer of Zinc (Zn) on the original bond pads 104, 108. The fine layer of Zinc will then act as a catalyst for the Nickel plating to follow. Once residues and oxides have been removed from the original bond pads 104, 108, in some embodiments the surface of the original bond pads 104, 108 is rendered to an increased degree of flatness by applying a lapping process. This has the added benefit of providing a uniformly smooth and consistent bond pad 104, 108 surface in preparation for following reconditioning/metallization (ENEPIG—electroless Nickel, electroless Palladium, immersion Gold, for example) or ball bonding operations. The various such processing steps described above, including removing original ball bonds and bond wires, impurities, residues, and oxides, various acid washes and rinses, and possibly lapping the surface, result in conditioned original bond pads 244.

Once in a clean and flat state, the conditioned original bond pads 244 or original bond pads 108 are ready to be reconditioned. Reconditioning of the present invention is a process whereby the original bond pads 108 or conditioned original bond pads 244 are built up by successive and ordered application of specific metallic layers prior to new wire bonding processes.

In one embodiment, after an extracted die 100 is removed from a packaged integrated circuit, only original bond wires 116 are removed—thus leaving original ball bonds 112 on less than all original bond pads 104 of the extracted die 100. Original ball bonds 112 must be removed prior to conditioning or reconditioning bond pads. Therefore, in some embodiments the metallic layers of the present invention are provided not to bare original bond pads 108, but rather original bond pads 104 following original ball bond 112 removal, or to any original bond pad 104, 108 intended to receive a new ball bond 236 and new bond wire 240. Conditioned original bond pads are original bond pads with original bond wires 116, original ball bonds 112, and residue/oxides removed. Reconditioned bond pads are conditioned original bond pads following application of the metallic layer structure shown and described with respect to FIGS. 2C-2E herein.

Referring now to FIG. 2C, a diagram illustrating a section A-A of electroless Nickel layer 216 application in accordance with embodiments of the present invention is shown. Electroless plating is more cost effective than electroplating since it does not require expensive photolithography and etch processes. However, electroless processes generally require thicker metal layers for good bondability.

A Nickel (Ni) layer 216 applied over conditioned original bond pads has been found to protect pad surfaces. Nickel possesses a much higher elastic modulus than either Copper (Cu) or Aluminum (Al), which leads Nickel to have high stiffness and fracture toughness and resist deflection and absorb energy during ball bonding processes. Thus, Nickel is a preferred metallic layer 216 for the initial layer application following original bond pad 104, 108 conditioning processes.

An electroless Nickel plating bath is very complex and contains more chemicals (i.e. reducing agents, complexant or chelating agents, stabilizers, etc) than the Nickel source alone. These bath components are known in the art and perform specific functions during the chemical reaction. They are important in order to obtain a good quality Nickel deposit and must be monitored carefully during processing.

The plating rate of Nickel is a controllable parameter during the plating process, which in turn affects the final surface roughness. A fast plating rate will obviously increase the process throughput, but fast plating rates can also result in a rougher Nickel finish. Therefore, a careful balance must be maintained between processing speed and surface quality. If the Nickel surface is too rough, the next successive metal layers to be plated over the Nickel will follow the contours and also result in a rougher surface. Both surface hardness and roughness have a strong effect on wire bondability and bond strength. Harder and rougher surfaces are typically less bondable. For wire bonding applications, the electroless Nickel layer 216 is generally 120-240 microinches thick.

Referring now to FIG. 2D, a diagram illustrating a section A-A of Electroless Palladium layer 220 application in accordance with embodiments of the present invention is shown. Electroless Palladium (Pd) 220 is applied over the Electroless Nickel (Ni) 216 layer of FIG. 2C in order to inhibit Nickel diffusion into the Immersion gold layer 224 applied afterward.

Palladium plating was first investigated as a replacement for purely gold plating in order to alleviate the high cost of gold plating. Palladium and Palladium-Nickel alloys were initially developed for contact wear resistance in connector applications, but other technical advantages were identified as usage grew. Not only is a pure Palladium layer very hard, but it is also very dense which assists as a diffusion barrier. As with the Electroless Nickel layer 216, the Electroless Palladium layer 220 requires a catalyst pretreatment to prepare the surface for deposition. The metal source is typically a Palladium-Ammonia compound with a hydrazine reducing agent for metal deposition. For wire bonding applications, the Electroless Palladium layer 220 is generally 2-4 microinches thick, approximately 2 orders of magnitude thinner than the Electroless Nickel layer 216.

Referring now to FIG. 2E, a diagram illustrating a section A-A of immersion Gold layer 228 application in accordance with embodiments of the present invention is shown. The immersion Gold layer 228 is applied over the electroless Palladium layer 220, and provides the top layer of the reconditioned bond pads 232. Gold has long been a mature plating process for semiconductor applications. Two types of Gold plating processes through chemical reactions are used today: immersion and autocatalytic. Immersion Gold plating 228 is a self-limiting galvanic displacement process, where no reducing agent is required. For wire bonding applications, the immersion Gold layer 228 is generally at least 1-2 microinches thick, and preferably thicker. Following the process step of FIG. 2E, the die is a reconditioned die 224.

Because the ENEPIG plating process uses Gold as the wire bonding layer with Gold bond wire, there is no Aluminum (Al)—Gold (Au) interface that can degrade and corrode. Thus, the ENEPIG plating process produces more reliable wire bonding interfaces and is preferred for high temperature applications over previous processes that maintained Al—Au interfaces and utilized moisture getter, noble gas insertion, and vacuum bakes to purge moisture from integrated circuit packages.

Referring now to FIG. 2F, a diagram illustrating a section A-A of new bond wires 240 and ball bonds 236 in accordance with embodiments the present invention is shown. The combination of the electroless Nickel layer 216, electroless Palladium layer 220, and the immersion Gold layer 228 produces a reconditioned bond pads 232. New gold bond wires 240 may be thermosonically welded to reconditioned bond pads 232, and will produce a new Gold ball bond 236 at each new bond wire 240 location.

In thermosonic welding, the interface temperature is typically between 125° C. and 220° C. For ball bonding, the new bond wire 240 is threaded through a capillary-shaped tool, and a spark melts the end of the wire forming a ball at the bottom of the tool. The bond (weld) is formed when the tool under load presses or deforms the ball against the heated bonding pad and ultrasonic energy is applied, completing the process.

Referring now to FIG. 3A, a diagram illustrating a section A-A of an extracted die 100 after a first rebonding process 300 in accordance with embodiments of the present invention is shown. The assembly step shown in FIG. 3A immediately follows the assembly step shown in FIG. 2B, where all original ball bonds 112 and original bond wires 116 have been removed from the extracted die 100, but a bond pad reconditioning process such as an ENEPIG process as shown in FIGS. 2C-2F is not used.

Extracted die 100 includes a die substrate 204 including various metallization layers known in the art. On the surface of the die substrate 204 are one or more original bond pads 104, 108 or conditioned original bond pads 244. A passivation layer 208 is applied over the die substrate 204 in order to protect the circuits of the die substrate 204, and the passivation layer 208 is relieved at each of the original bond pads 104, 108 in order to provide bonding access.

Referring now to FIG. 3B, a diagram illustrating a section A-A of an extracted die 100 after a second rebonding process 304 in accordance with embodiments of the present invention is shown. The assembly step shown in FIG. 3B immediately follows the assembly step shown in FIG. 2A, where all original bond wires 116 have been removed from the extracted die 100, but one or more original ball bonds 112 still remain and a bond pad reconditioning process such as an ENEPIG process as shown in FIGS. 2C-2F is not used. New ball bonds 236 and new bond wires 240 are provided either above original ball bonds 112 or original bond pads 108.

Referring now to FIG. 4A, an illustration depicting an assembled package base 400 with new bond wires 240 in accordance with embodiments of the present invention is shown. The assembled package base 400 includes a new package base 408. In one embodiment, the new package base 408 is a non-hermetic new package base 408. In another embodiment, the new package base 408 is a hermetic new package base 408. In non-hermetic applications, new package base 408 is generally plastic. If the new package base 408 is a hermetic package base 408, it may be formed from ceramic, metal, or glass materials.

After conditioning and/or reconditioning any original bond pads 104, 108 of the extracted die 100, the extracted die 100 is bonded to an interposer 404 with a suitable die attach adhesive 412. The extracted die 100 bonded to the interposer 404 is referred to herein as a remapped extracted die 428. This is described in more detail in FIG. 6A. In one embodiment, the original bond pads 104, 108 are prepared by removing original bond wires 116. In other embodiments, the original bond pads 104, 108 are prepared by removing original ball bonds 112 and original bond wires 116, and removing any traces of original ball bonds 112, residues, oxides, and other deposits from the original bond pads 104 (i.e. conditioning processes as described herein). In some embodiments, the original bond pads 104, 108 are buffed, polished, or lapped before adding any new ball bonds 236 and new bond wires 240.

The new package base 408 includes a cavity 416 into which the remapped extracted die 428 is placed. Die attach adhesive 412 is applied to the new package base 408 such that when the extracted die 100 is inserted into the new package base cavity 416, the die attach adhesive 412 makes simultaneous contact with both the new package base 408 and the extracted die 100. Although not shown for clarity, a thin layer of die attach adhesive 412 would bond the extracted die 100 to the interposer 404.

In embodiments where the new package base 408 is a component of a hermetic package 452, die attach adhesive 412 is a low-halide compound adhesive, where a low halide compound has less than 10 parts per million (ppm) halide. Die attach adhesive 412 therefore bonds the extracted die 100 to the new package base 408, and protects the integrity of the interior of the assembled package base 400. It has been well established that halogens in an Au—Al bond interface degrade Au—Al bond strength since out-gassed products from adhesives containing halogens rapidly corrode Al metallization in integrated circuits at high temperatures, thus reducing product lifetime at high temperatures.

Associated with the new package base 408 are a series of package leads 424, which provide interconnection between circuitry of the extracted die 100 and circuitry of a printed circuit board on which the packaged integrated circuit 440, 452 is eventually mounted. For example, if an SO-24 ceramic package is used for the packaged integrated circuit, 24 package leads 424 would be present, configured as 12 package leads 424 on each of two opposite sides of the new package base 408. If a PLCC-68 ceramic package is used for the integrated circuit, 68 package leads 424 would be present, configured as 17 package leads 424 on each of the four sides of the new package base 408. The present invention may be used for any type of previous integrated circuit package or any type of new hermetic 452 or non-hermetic 440 integrated circuit package.

After mounting the remapped extracted die 428 into the new package base 408 using a die attach adhesive 412, new bond wires 240 are then attached as described in more detail in FIG. 6B. New bond wires 240 are commonly 1-3 mils in diameter, but may be any usable diameter. In one embodiment, a new ball bond 236 is formed on top of an original ball bond 112. In other embodiments, a new ball bond 236 is formed on top of original bond pads 108. In a preferred embodiment, new bond wires 240 are Gold (Au) bond wires. In other embodiments, new bond wires 240 are Aluminum (Al) or Copper (Cu) bond wires.

Referring now to FIG. 4B, an illustration depicting an assembled non-hermetic integrated circuit package 440 with an extracted die 100 in accordance with embodiments of the present invention is shown. Packaged integrated circuit 440 is Assembled package base 400 with a package lid 432 attached. Where the new package base 408 and package lid 432 are non-plastic materials, lid seal adhesive 436 is generally required. In non-hermetic applications, package lid 432 is generally plastic and is molded to a plastic new package base 408 with an encapsulation process. In such cases, a lid seal adhesive 436 may not be required.

Referring now to FIG. 4C, an illustration depicting an assembled hermetic integrated circuit package 452 with an extracted die 100 in accordance with embodiments of the present invention is shown. Packaged hermetic integrated circuit 452 includes the assembled hermetic package base 400 of FIG. 4A and additional components described below.

For a hermetic integrated circuit package 452 including a hermetic new package base 408, once all new bond wires 240 are bonded between package leads 424 and downbonds and the remapped extracted die 428, the assembled package base 400 including remapped extracted die 428, die attach adhesive 412, new package base 408, package leads 424, and new bond wires 240, may be first and second vacuum baked according to the processes of parent application Ser. No. 13/623,603.

The assembled hermetic integrated circuit package 452 including low halide die attach adhesive 412, noble inert gas 448, and moisture getter 444 is used for a high-temperature application exposure (greater than 150 degrees Celsius) with original bond pads 104 where the original ball bonds 112 were not removed and/or the original bond pads 104, 108 were not reconditioned 232.

Referring now to FIG. 5, an illustration depicting an interposer 404 for an extracted die 100 in accordance with embodiments of the present invention is shown. Interposer 404 is a substrate that the extracted die 100 is mounted on one side of, and translates original bond pad 104, 108, conditioned original bond pad, or reconditioned bond pad 232 locations into bond pad locations that match a desired pinout of packaged integrated circuits 440, 452. Interposer 404 is a substrate or other material such as FR-4, Kapton, Teflon, or Polyamide suitable for mounting within a new package base 408 and carrying electrical signals to and from the extracted die 100 and package leads 424 or downbonds.

Interposer 404 includes a location 512 for mounting the extracted die 100 or modified die 212 on a specified side of interposer 404. Extracted die 100 may be secured to interposer 404 with die attach adhesive 412, an epoxy, or other chemical and/or mechanical means known in the art. In most embodiments, extracted die 100 is mounted centrally on the interposer 404 in order to facilitate wire bonding. However, in some embodiments the extracted die 100 may not be centrally mounted on interposer 404 for various reasons.

Interposer 404 includes a first set of bond pads 504 generally oriented around the periphery of the extracted die/modified die Location 512. The first set of bond pads 504 provide attachment points for new bond wires 240 between the extracted die 100 and the interposer 404.

In general, each of the first set of bond pads 504 is electrically connected to each of a second set of bond pads 508 via rerouting circuitry within the interposer 404. However, it is not a requirement that every such pad 504, 508 be thusly connected. The second set of bond pads 508 is generally oriented around the periphery of the interposer 404. The second set of bond pads 508 provide attachment points for new bond wires 240 between the interposer 404 and package leads 424 and downbonds of the new integrated circuit package base 408.

In most applications, the interposer 404 is designed so that the second bond pads 508 are as close as possible to the package base bond pad 604 or package lead 424 that each second bond pad 508 gets bonded to. This may require routing connections between some first bond pads 504 and second bond pads 508 across most of the interposer 404. To some extent the routing length of such connection may be mitigated by orienting the extracted die/modified die location 512 clockwise or counterclockwise on the interposer 404, and this must be independently evaluated for each extracted die 100/modified die 212 and interposer 404 combination.

Referring now to FIG. 6A, an illustration depicting a top view of a new package base 408 before wire bonding in accordance with embodiments of the present invention is shown. The remapped extracted die 608 is securely mounted in the cavity 416 of the new package base 408 with die attach adhesive 412. The new package base 408 has a plurality of package base bond pads 604, which provide a conduction path to the package leads 424 on the exterior of the new package base 408. One package lead 424 is provided on the exterior of the new package base 408 for every package base bond pad 604. The new package base 408 has different pin assignments than the previous package base the extracted die 100 was removed from.

Referring now to FIG. 6B, an illustration depicting a top view of a new package base 408 after wire bonding in accordance with embodiments of the present invention is shown. FIG. 6B illustrates the same point in the assembly process as shown in FIG. 4A. The new package base 408 is fully assembled, and is ready for a package lid 432 to be added or else encapsulation as a molded packaged integrated circuit 440.

As shown in FIG. 6B, the new package base 408 has new bond wires 240 added. New bond wires 240 connect original bond pads 104, 108 of the extracted die 100 or modified die 212 to the first bond pads 504 (usually but not necessarily, closest to the extracted die 100 or modified die 212) of the interposer 404. Other new bond wires 240 connect the second bond pads 508 (usually but not necessarily, closest to the edge of the interposer 404) of the interposer 404 to package base bond pads 604.

It is possible that some original bond pads 104, 108 of the extracted die 100/modified die 212 and Package base bond pads 604 will be no connects. No connects will not have a new bond wire 240 or new ball bond 236 attached. In FIG. 6B, there are two no connects 616 on the original bond pads 104, 108 of the extracted die 100, and two no connects 612 on the package base bond pads 604. However, there may practically be any number of no connects, including zero.

Referring now to FIG. 7A, a flowchart illustrating an assembly method for a packaged integrated circuit 440 in accordance with a first embodiment of the present invention is shown. Flow begins at block 704.

At block 704, an extracted die 100 is removed from previous packaged integrated circuit. The extracted die 100 will have at least one original ball bond 112 and one original bond wire 116. It is possible that some or all existing original bond wires 116 will be removed during the die extraction process. Flow proceeds to block 708.

At block 708, original bond wires 116 are removed from original ball bonds 112 of extracted die 100, if any original bond wires 116 are still present. Flow proceeds to block 712.

At block 712, the extracted die 100 is bonded to the interposer 404 to create a remapped extracted die 608. Flow proceeds to block 716.

At block 716, die attach adhesive 412 is applied to the package base cavity 416. Flow proceeds to block 720.

At block 720, the remapped extracted die 608 is placed into the package base cavity 416 to secure the remapped extracted die 608 to the new package base 408. As an alternative to blocks 712-720, the interposer 404 may first be bonded to the new package base 408, then the extracted die 100 may be bonded to the interposer 404. Flow proceeds to blocks 724 and 728.

At block 724, new bond wires 240 are provided between the extracted die 100 and the first set of bond pads 504 of the interposer 404. If there is an original ball bond 112 on an original bond pad 104 of the extracted die 100, a new ball bond 236 is bonded to the original ball bond 112 as shown in FIG. 3B. Flow proceeds to block 732.

At block 728, new bond wires 240 are provided between the second bond pads 508 of the interposer 404 and package leads 424 or downbonds, as required. It should be noted that steps 724 and 728 may be completed in any order, depending on what new bond wire 240 installation produces the most efficient and reliable process. Flow proceeds to block 732.

At block 732, the package lid 432 is sealed to the assembled package base 400, or alternatively, the non-hermetic packaged integrated circuit 440 is encapsulated. Flow proceeds to block 736.

At block 736, the packaged integrated circuit 440 is electrically tested. Electrical testing includes continuity tests or functional tests, or both. If the packaged integrated circuit 440 has passed the electrical tests, and the package leads 424 are properly trimmed, the packaged integrated circuit 440 is marked and is a complete new packaged integrated circuit 440 ready for use. Flow ends at block 736.

Referring now to FIG. 7B, a flowchart illustrating an assembly method for a packaged integrated circuit 440 in accordance with a second embodiment of the present invention is shown. Flow begins at block 750.

At block 750, an extracted die 100 is removed from previous packaged integrated circuit. The extracted die 100 will have at least one original ball bond 112 and one original bond wire 116. It is possible that some or all existing original bond wires 116 will be removed during the die extraction process. Flow proceeds to block 754.

At block 754, original bond wires 116 and original ball bonds 112 are removed from extracted die 100. Flow proceeds to block 758.

At block 758, the original bond pads 104, 108 are conditioned and/or reconditioned. Conditioning includes removing any impurities from original bond pads 104, 108 and reconditioning applies an ENEPIG surface treatment in order to prepare the original bond pads 104, 108 to accept new ball bonds 236 and new bond wires 240. Instead of reconditioning, the original bond pads 104, 108 may be cleaned and/or lapped with all metallic and chemical residues removed. Flow proceeds to block 762.

At block 762, the extracted die 100 is bonded to the interposer 404 to create a remapped extracted die 608. Flow proceeds to block 766.

At block 766, die attach adhesive 412 is applied to the package base cavity 416. Flow proceeds to block 770.

At block 770, the remapped extracted die 608 is placed into the package base cavity 416 to secure the remapped extracted die 608 to the new package base 408. As an alternative to blocks 762-770, the interposer 404 may first be bonded to the new package base 408, then the extracted die 100 may be bonded to the interposer 404. Flow proceeds to blocks 774 and 778.

At block 774, new bond wires 240 are provided between original bond pads 104, 108, conditioned original bond pads, or reconditioned bond pads 232 of the extracted die 100 and the first set of bond pads 504 of the interposer 404. Flow proceeds to block 782.

At block 778, new bond wires 240 are provided between the second bond pads 508 of the interposer 404 and package leads 424 or downbonds, as required. It should be noted that steps 774 and 778 may be completed in any order, depending on what new bond wire 240 installation produces the most efficient and reliable process. Flow proceeds to block 782.

At block 782, the package lid 432 is sealed to the assembled package base 400, or alternatively, the non-hermetic packaged integrated circuit 440 is encapsulated. Flow proceeds to block 786.

At block 786, the packaged integrated circuit 440 is electrically tested. Electrical testing includes continuity tests or functional tests, or both. If the packaged integrated circuit 440 has passed the electrical tests, and the package leads 424 are properly trimmed, the packaged integrated circuit 440 is marked and is a complete new packaged integrated circuit 440 ready for use. Flow ends at block 786.

Referring now to FIG. 8A, a flowchart illustrating an assembly method for a hermetic packaged integrated circuit 452 in accordance with a third embodiment of the present invention is shown. Flow begins at block 804.

At block 804, an extracted die 100 is removed from previous packaged integrated circuit. The extracted die 100 will have at least one original ball bond 112 and one original bond wire 116. It is possible that some or all existing original bond wires 116 will be removed during the die extraction process. Flow proceeds to block 808.

At block 808, original bond wires 116 are removed from original ball bonds 112 of extracted die 100, if any original bond wires 116 are still present. Flow proceeds to block 812.

At block 812, the extracted die 100 is bonded to the interposer 404 to create a remapped extracted die 608. Flow proceeds to block 816.

At block 816, a low halide content die attach adhesive 412 is applied to the package base cavity 416. Flow proceeds to block 820.

At block 820, the remapped extracted die 608 is placed into the package base cavity 416 to secure the remapped extracted die 608 to the new package base 408. As an alternative to blocks 812-820, the interposer 404 may first be bonded to the new package base 408, then the extracted die 100 may be bonded to the interposer 404. Flow proceeds to blocks 824 and 828.

At block 824, new bond wires 240 are provided between the extracted die 100 and the first set of bond pads 504 of the interposer 404. If there is an original ball bond 112 on an original bond pad 104 of the extracted die 100, a new ball bond 236 is bonded to the original ball bond 112 as shown in FIG. 3B. Flow proceeds to block 832.

At block 828, new bond wires 240 are provided between the second bond pads 508 of the interposer 404 and package leads 424 or downbonds, as required. It should be noted that steps 724 and 728 may be completed in any order, depending on what new bond wire 240 installation produces the most efficient and reliable process. Flow proceeds to block 832.

At block 832, the assembled hermetic package base 400 is first vacuum baked. The assembled hermetic package base 400 includes the hermetic new package base 408, package leads 424, remapped extracted die 608, the die attach adhesive 412, and new bond wires 240. The process of first vacuum baking is illustrated in FIG. 11 of application Ser. No. 13/623,603. Flow proceeds to block 836.

At block 836, the assembled hermetic package base 400 is removed from the vacuum baking apparatus and the hermetic package lid 432 is placed on the assembled hermetic package base 400. The hermetic package lid 432 is placed in proper orientation such that the combination of the hermetic package lid 432 and the assembled hermetic package base 400 is hermetically sealed following block 840. A moisture getter 444 may be applied to the interior of the hermetic package lid 432. In a preferred embodiment, the moisture getter 444 is uniformly applied with a thickness of three or more microns to the interior surface of the hermetic package lid 432 using a deposition process. Flow proceeds to block 840.

At block 840, the assembled hermetic package base 400 and hermetic package lid 432 are placed into the vacuum baking apparatus and second vacuum baked. Unlike block 832, where only the assembled hermetic package base 400 is first vacuum baked, block 840 requires the hermetic package lid 432 to be placed on the assembled hermetic package base 400 prior to initiating the second vacuum bake process. The second vacuum bake process is illustrated in FIG. 12 of application Ser. No. 13/623,603. Flow proceeds to block 844.

At block 844, a vacuum pump in the vacuum baking apparatus is turned off. Turning the vacuum pump off prevents gases from being evacuated from the vacuum baking apparatus, and is required in order for noble gas 448 injected in block 848 to remain in the packaged hermetic integrated circuit 452 after the hermetic package lid 432 is sealed to the assembled hermetic package base 400. Flow proceeds to block 848.

At block 848, a noble gas 448 is injected into the packaged hermetic integrated circuit 452, while the packaged hermetic integrated circuit 452 is in the vacuum baking apparatus, and immediately following the second vacuum bake process. In a preferred embodiment, the noble gas 448 is Argon, and the noble gas 448 is injected into the cavity 416 to a pressure of between 0.1 to 2 Atmospheres (ATM), preferably 1 ATM, at a temperature between 200° C. and 275° C., preferably 255° C. Flow proceeds to block 852.

At block 852, the packaged hermetic integrated circuit 452 is hermetically and/or electrically tested. Hermetic testing is generally performed according to MIL-STD-883J. Electrical testing includes either continuity tests or functional tests, or both. If the packaged hermetic integrated circuit 452 has passed the hermeticity and electrical tests and the package leads 424 are properly trimmed to the appropriate length, the packaged hermetic integrated circuit 452 is marked and is a complete hermetic integrated circuit 452 ready for use. Flow ends at block 852.

Referring now to FIG. 8B, a flowchart illustrating an assembly method for a hermetic packaged integrated circuit 452 in accordance with a fourth embodiment of the present invention is shown. Flow begins at block 804.

At block 856, an extracted die 100 is removed from previous packaged integrated circuit. The extracted die 100 will have at least one original ball bond 112 and one original bond wire 116. It is possible that some or all existing original bond wires 115 will be removed during the die extraction process. Flow proceeds to block 860.

At block 860, original bond wires 116 are removed from original ball bonds 112 of extracted die 100. Flow proceeds to block 864.

At block 864, the original bond pads 104, 108 are conditioned and/or reconditioned. Conditioning includes removing any impurities from original bond pads 104, 108 and reconditioning applies an ENEPIG surface treatment in order to prepare the original bond pads 104, 108 to accept new ball bonds 236 and new bond wires 240. Instead of reconditioning, the original bond pads 104, 108 may be cleaned and/or lapped with all metallic and chemical residues removed. Flow proceeds to block 868.

At block 868, the extracted die 100 is bonded to the interposer 404 to create a remapped extracted die 608. Flow proceeds to block 872.

At block 872, a low-halide content die attach adhesive 412 is applied to the package base cavity 416. Flow proceeds to block 876.

At block 876, the remapped extracted die 608 is placed into the package base cavity 416 to secure the remapped extracted die 608 to the new package base 408. As an alternative to blocks 868-876, the interposer 404 may first be bonded to the new package base 408, then the extracted die 100 may be bonded to the interposer 404. Flow proceeds to blocks 880 and 884.

At block 880, new bond wires 240 are provided between original bond pads 104, 108, conditioned original bond pads, or reconditioned bond pads 232 of the extracted die 100 and the first set of bond pads 504 of the interposer 404. Flow proceeds to block 886.

At block 884, new bond wires 240 are provided between the second bond pads 508 of the interposer 404 and package leads 424 or downbonds, as required. It should be noted that steps 880 and 884 may be completed in any order, depending on what new bond wire 240 installation produces the most efficient and reliable process. Flow proceeds to block 886.

At block 886, the assembled hermetic package base 400 is first vacuum baked. The assembled hermetic package base 400 includes the hermetic new package base 408, package leads 424, remapped extracted die 608, the die attach adhesive 412, and new bond wires 240. The process of first vacuum baking is illustrated in FIG. 11 of application Ser. No. 13/623,603. Flow proceeds to block 888.

At block 888, the assembled hermetic package base 400 is removed from the vacuum baking apparatus and the hermetic package lid 432 is placed on the assembled hermetic package base 400. The hermetic package lid 432 is placed in proper orientation such that the combination of the hermetic package lid 432 and the assembled hermetic package base 400 is hermetically sealed following block 840. In some embodiments, a moisture getter 444 is applied to the interior of the hermetic package lid 432. In a preferred embodiment, the moisture getter 444 is uniformly applied with a thickness of three or more microns to the interior surface of the hermetic package lid 432 using a deposition process. Flow proceeds to block 890.

At block 890, the assembled hermetic package base 400 and hermetic package lid 432 are placed into the vacuum baking apparatus and second vacuum baked. Unlike block 832, where only the assembled hermetic package base 400 is first vacuum baked, block 840 requires the hermetic package lid 432 to be placed on the assembled hermetic package base 400 prior to initiating the second vacuum bake process. The second vacuum bake process is illustrated in FIG. 12 of application Ser. No. 13/623,603. Flow proceeds to block 892.

At block 892, a vacuum pump in the vacuum baking apparatus is turned off. Turning the vacuum pump off prevents gases from being evacuated from the vacuum baking apparatus, and is required in order for noble gas 448 injected in block 848 to remain in the packaged hermetic integrated circuit 452 after the hermetic package lid 432 is sealed to the assembled hermetic package base 400. Flow proceeds to block 894.

At block 894, a noble gas 448 is injected into the packaged hermetic integrated circuit 452, while the packaged hermetic integrated circuit 452 is in the vacuum baking apparatus, and immediately following the second vacuum bake process. In a preferred embodiment, the noble gas 448 is Argon, and the noble gas 448 is injected into the cavity 416 to a pressure of between 0.1 to 2 Atmospheres (ATM), preferably 1 ATM, at a temperature between 200° C. and 275° C., preferably 255° C. Flow proceeds to block 896.

At block 896, the packaged hermetic integrated circuit 452 is hermetically and/or electrically tested. Hermetic testing is generally performed according to MIL-STD-883J. Electrical testing includes either continuity tests or functional tests, or both. If the packaged hermetic integrated circuit 452 has passed the hermeticity and electrical tests and the package leads 424 are properly trimmed to the appropriate length, the packaged hermetic integrated circuit 452 is marked and is a complete hermetic integrated circuit 452 ready for use. Flow ends at block 896.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

I claim:

1. A remapped extracted die, comprising:
   an extracted die removed from a previous integrated circuit package, the extracted die comprising a plurality of original bond pads having locations that do not correspond to desired pin assignments of a new package base; and
   an interposer, bonded to the extracted die, comprising:
      first bond pads configured to receive new bond wires from the plurality of original bond pads; and
      second bond pads corresponding to desired pin assignments of the new package base, each individually electrically coupled to one of the first bond pads and configured to receive new bond wires from package leads or downbonds of the new package base.

2. The remapped extracted die of claim 1, wherein locations that do not correspond to desired pin assignments of a new package base comprises bond pad locations for new bond wires that cross other new bond wires if the extracted die is bonded to the new package base without the interposer.

3. The remapped extracted die of claim 1, wherein a pinout of the previous integrated circuit package is different than a pinout of the new package base.

4. A packaged integrated circuit, comprising:
   an extracted die removed from a previous packaged integrated circuit;
   a new package base, comprising package leads;
   an interposer, bonded to the extracted die and the new package base, comprising first and second bond pads;
   new bond wires, provided between the extracted die and first bond pads and between the second bond pads and package leads or downbonds to the new package base;
   a package lid sealed to the new package base.

5. The packaged integrated circuit of claim 4, wherein original bond wires are not bonded to the extracted die.

6. The packaged integrated circuit of claim 5, wherein the extracted die comprises conditioned original bond pads, wherein conditioned original bond pads comprises no original bond wires or original ball bonds on the original bond pads and no traces of residues or oxides are present on the original bond pads, wherein the conditioned original bond pads are ready to accept new bond wires and new ball bonds.

7. The packaged integrated circuit of claim 6, wherein the extracted die comprises reconditioned bond pads, wherein reconditioned bond pads comprises layers of nickel, palladium, and gold covering the conditioned original bond pads, wherein the reconditioned bond pads are ready to accept new bond wires and new ball bonds.

8. The packaged integrated circuit of claim 7, wherein new bond wires are provided between the extracted die and first bond pads comprises new bond wires are provided between the reconditioned bond pads and first bond pads.

9. The packaged integrated circuit of claim 4, wherein new bond wires are provided between the extracted die and first bond pads comprises new bond wires provided between existing ball bonds on the extracted die and the first bond pads.

10. The packaged integrated circuit of claim 9, wherein the existing ball bonds were on original bond pads within the previous packaged integrated circuit.

11. The packaged integrated circuit of claim 4, wherein the interposer translates first bond pad locations into second bond pad locations, wherein the second bond pad locations allow new bond wires to not cross other new bond wires between the second bond pads and package leads and downbonds of the new package base.

12. A new packaged integrated circuit, comprising:
   a new package base, comprising a cavity and package leads;
   a remapped extracted die, secured within the cavity, comprising:
      an extracted die removed from a previous packaged integrated circuit; and
      an interposer, bonded to the extracted die and the new package base, comprising first bond pads electrically coupled to second bond pads;
   new bond wires, provided between the extracted die and first bond pads and between the second bond pads and the package leads or downbonds;
   a package lid sealed to the new package base.

13. The new packaged integrated circuit of claim 12, wherein second bond pad locations are configured to allow new bond wires to not cross other new bond wires between the second bond pads and package leads or downbonds of the new package base.

14. The new packaged integrated circuit of claim 12, the extracted die comprising:
   original bond pads; and
   one or more original ball bonds, wherein no original bond wires are coupled to the one or more original ball bonds prior to bonding the extracted die to the interposer.

15. The new packaged integrated circuit of claim 14, wherein new bond wires are provided between the extracted die and first bond pads comprises new bond wires are provided between original ball bonds on the extracted die and the first bond pads.

16. The new packaged integrated circuit of claim 14, wherein original bond wires and original ball bonds are not bonded to the extracted die.

17. The new packaged integrated circuit of claim 16, wherein the extracted die comprises conditioned original bond pads, wherein conditioned original bond pads comprises no original bond wires or original ball bonds on the original bond pads and no traces of residues or oxides are present on the original bond pads, wherein the conditioned original bond pads are ready to accept new bond wires and new ball bonds.

18. The new packaged integrated circuit of claim 16, wherein the extracted die comprises reconditioned bond pads, wherein reconditioned bond pads comprises a Nickel layer covering the conditioned original bond pads, a Palladium layer covering the Nickel layer, and a Gold layer covering the Palladium layer, wherein the reconditioned bond pads are ready to accept new bond wires and new ball bonds.

19. The new packaged integrated circuit of claim 18, wherein new bond wires are provided between the extracted die and first bond pads comprises new bond wires are provided between the reconditioned bond pads and first bond pads.

20. The new packaged integrated circuit of claim 12 comprising:
 a new hermetic package base;
 a hermetic package lid;
 and at least one of:
  a low-halide die attach adhesive;
  an inert noble gas; and
  a moisture getter.

* * * * *